United States Patent
Van Der Vleuten et al.

(10) Patent No.: US 7,107,212 B2
(45) Date of Patent: *Sep. 12, 2006

(54) BITSTREAM DATA REDUCTION CODING BY APPLYING PREDICTION

(75) Inventors: Renatus J. Van Der Vleuten, Eindhoven (NL); Alphons A. M. L. Bruekers, Eindhoven (NL); Arnoldus W. J. Oomen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 291 days.

This patent is subject to a terminal disclaimer.

(21) Appl. No.: 10/304,122

(22) Filed: Nov. 25, 2002

(65) Prior Publication Data

US 2003/0074193 A1 Apr. 17, 2003

Related U.S. Application Data

(63) Continuation of application No. 09/726,764, filed on Nov. 30, 2000, now Pat. No. 6,535,845, which is a continuation of application No. 08/966,375, filed on Nov. 7, 1997, now Pat. No. 6,289,306.

(30) Foreign Application Priority Data

Nov. 7, 1996 (EP) .................................. 96203105
Jun. 4, 1997 (EP) .................................. 97201680

(51) Int. Cl.
*G10L 19/02* (2006.01)

(52) U.S. Cl. .................... 704/229; 704/200.1; 704/219; 704/501; 341/65; 341/143; 341/177; 375/262; 375/240; 348/459; 348/409.1

(58) Field of Classification Search ................ 704/229, 704/500, 501, 205, 230, 240, 200.1, 210, 704/226, 225, 203, 212, 219, 207; 341/143, 341/177, 65; 375/240, 262; 714/775; 348/459, 348/409.1; 382/239

See application file for complete search history.

(56) References Cited

U.S. PATENT DOCUMENTS

| 3,716,789 A | * | 2/1973 | Brown et al. ................ 704/212 |
| 4,618,210 A | | 10/1986 | Kondo |
| 4,633,490 A | * | 12/1986 | Goertzel et al. ............. 375/240 |
| 4,704,730 A | * | 11/1987 | Turner et al. ................ 704/210 |
| 4,747,654 A | | 5/1988 | Yi-Yan |

(Continued)

FOREIGN PATENT DOCUMENTS

EP 0647861 A1 4/1995

(Continued)

OTHER PUBLICATIONS

Kasuga ("An Approach To High Resolution D/A Converter Utilizing A Linear Predictive Coding", IEEE International Conference on ICASSP Acoustics, Speech, and Signal Processing, Apr. 1986).*

(Continued)

*Primary Examiner*—Vijay Chawan

(57) ABSTRACT

A data processing apparatus for data processing an audio signal includes an input terminal (1) for receiving the audio signal, a 1-bit A/D converter (4) for A/D converting the audio signal to for a bitstream signal, a prediction unit (10) for carrying out a prediction step on the bitstream signal to form a predicted bitstream signal, a signal combination unit (42) for combining the bitstream signal and the predicted bitstream signal to form a residue bitstream signal, and an output terminal (14) for supplying the residual bitstream signal.

49 Claims, 9 Drawing Sheets

U.S. PATENT DOCUMENTS

| | | | |
|---|---|---|---|
| 4,799,242 A * | 1/1989 | Vermeulen | 704/229 |
| 4,813,757 A | 3/1989 | Sakano et al. | |
| 4,846,542 A | 7/1989 | Okayama | |
| 4,862,168 A * | 8/1989 | Beard | 704/226 |
| 4,905,002 A * | 2/1990 | Jones et al. | 341/77 |
| 5,002,350 A | 3/1991 | Dragone | |
| 5,013,113 A | 5/1991 | Soref | |
| 5,030,952 A * | 7/1991 | Ledzius et al. | 341/143 |
| 5,039,993 A | 8/1991 | Dragone | |
| 5,091,955 A * | 2/1992 | Iseda et al. | 704/230 |
| 5,155,743 A * | 10/1992 | Jacobs | 341/77 |
| 5,243,672 A | 9/1993 | Dragone | |
| 5,276,764 A * | 1/1994 | Dent | 704/200 |
| 5,353,408 A * | 10/1994 | Kato et al. | 704/226 |
| 5,412,744 A | 5/1995 | Dragone | |
| 5,450,511 A | 9/1995 | Dragone | |
| 5,467,418 A | 11/1995 | Dragone | |
| 5,555,273 A * | 9/1996 | Ishino | 704/229 |
| 5,581,643 A | 12/1996 | Wu | |
| 5,621,760 A * | 4/1997 | Gotoh et al. | 704/230 |
| 5,673,291 A * | 9/1997 | Dent | 375/262 |
| 5,687,191 A * | 11/1997 | Lee et al. | 704/200.1 |
| 5,706,377 A | 1/1998 | Li | |
| 5,708,511 A * | 1/1998 | Gandhi et al. | 382/239 |
| 5,784,017 A * | 7/1998 | Craven | 341/126 |
| 5,809,472 A * | 9/1998 | Morrison | 704/500 |
| 5,812,971 A * | 9/1998 | Herre | 704/230 |
| 5,835,034 A * | 11/1998 | Seroussi et al. | 341/65 |
| 5,841,931 A | 11/1998 | Foresi et al. | |
| 5,854,599 A * | 12/1998 | Heo et al. | 341/143 |
| 5,862,153 A * | 1/1999 | Kikuchi et al. | 714/775 |
| 5,864,800 A * | 1/1999 | Imai et al. | 704/229 |
| 5,884,269 A * | 3/1999 | Cellier et al. | 704/501 |
| 5,938,811 A | 8/1999 | Greene | |
| 6,034,629 A * | 3/2000 | Heo et al. | 341/143 |
| 6,064,954 A * | 5/2000 | Cohen et al. | 704/207 |
| 6,072,844 A * | 6/2000 | Inoue et al. | 704/225 |
| 6,108,478 A | 8/2000 | Harpon et al. | |
| 6,118,909 A | 9/2000 | Chen et al. | |
| 6,151,075 A * | 11/2000 | Shin et al. | 348/459 |
| 6,157,330 A * | 12/2000 | Bruekers et al. | 341/143 |
| 6,232,899 B1 * | 5/2001 | Craven | 341/126 |
| 6,249,895 B1 * | 6/2001 | Kikuchi et al. | 714/775 |
| 6,269,338 B1 * | 7/2001 | Bruekers et al. | 704/500 |
| 6,272,182 B1 * | 8/2001 | Dijkmans | 704/205 |
| 6,275,176 B1 * | 8/2001 | Bruekers et al. | 341/107 |
| 6,289,306 B1 * | 9/2001 | Van Der Vleuten et al. | 704/219 |
| 6,385,588 B1 * | 5/2002 | Van Der Vleuten | 704/504 |
| 6,535,845 B1 * | 3/2003 | Van Der Vleuten et al. | 704/219 |
| 6,680,972 B1 * | 1/2004 | Liljeryd et al. | 704/203 |
| 2001/0010711 A1 * | 8/2001 | Dijkmans | 704/501 |

FOREIGN PATENT DOCUMENTS

| | | | |
|---|---|---|---|
| EP | 0985942 A2 | | 3/2000 |
| GB | 2 288 043 | * | 10/1995 |
| JP | 58-204632 | * | 11/1983 |
| JP | 63-197923 | | 8/1988 |
| JP | 01-272326 | * | 10/1989 |
| JP | 2-179621 | | 7/1990 |
| JP | 6-186598 | | 7/1994 |
| JP | 06-232754 | * | 8/1994 |
| NL | WO 97/19520 | * | 5/1997 |
| NL | WO 98/16014 | * | 4/1998 |

OTHER PUBLICATIONS

Feldman et al ("A Split Band Adaptive Predictive Coding (SBAPC) Speech System", IEEE International Conference on Acoustics, Speech, and Signal Processing, Apr. 1980).*

Chen et al ("Vector Adaptive Predictive Coding of Speech at 9.6 kb/s", IEEE International Conference on ICASSP, Apr. 1986).*

Eerola et al ("Second-Order Sampling And Oversampled A/D- And D/A-Converters In Digital Data Transmission", IEEE International Sympoisum on Circuits and Systems, Jun. 1991).*

Temes et al ("A Tutorial Discussion Of The Oversampling Method For A/D and D/A Conversion", IEEE International Symposium on Circuits and Systems, May 1990).*

Abe, et al., *Optical Path Length Trimming Technique using Thin Film Heaters for Silica-Based Waveguides on Si*, Electronics Letters , Sep. 12, 1996, vol. 32-No. 19, pp. 1818-1820.

Albert, J., *Planar Fresnel Lens Photoimprinted in a Germanium-Doped Silica Optical Waveguide*, Optics Letters, May 15, 1995, vol. 20-No. 10, pp. 1136-1138.

Aman, M.C., *Calculation of Metal-Clad Ridge-Waveguide (MCRW) Laser Modes by Mode Coupling Technique*, Journal of Lightwave Technology, vol. LT-4, No. 6, Jun. 1986, p. 689-693.

Amann, M.C. et al, *Calculation Of The Effective Refractive-Index Step For The Metal-Cladded-Ridge-Waveguide Laser*, Applied Optics, vol. 20, No. 8, Apr. 15, 1981, p. 1483-1486.

Baba, S. et al., *A Novel Integrated-Twin-Guide (ITG) Optical Switch with a Built-in TIR Region*; IEEE Photonics Technology Letters; vol. 4, No. 5, May 1992, p. 486-488.

Benson, T.M., *Etched-Wall Bent-Guide Structure for Integrated Optics in the III-V Semiconductors*; Journal of Lightwave Technology; vol. LT-2, No. 1, Feb. 1984; p. 31-34.

Berry, G.M. et al., *Analysis Of Multiplayer Semiconductor Rib Waveguides With High Refractive Index Substrates*, Electronics Letters; vol. 29, No. 22; Oct. 28, 1993, p. 1941-1942.

Betty, I. et al., *A Robust, Low-Crosstalk, InGaAsP/InP Total-Internal-Reflection Switch For Optical Cross-Connect Application.*

Burke, S.V., *Spectral Index Method Applied to Coupled Rib Waveguides*; Electronics Letters, vol. 25, No. 9, Apr. 27, 1989, p. 605-606.

Burns, W.K. et al., *Mode Conversion in Planar-Dielectric Separating Waveguides*; IEEE Journal of Quantum Electronics, vol. QE-11, No. 1, Jan. 1975; p. 32-39.

Cai, Y. et al., *A Novel Three-Guide Optical Coupler Using A Taper-Formed Waveguide*; j. Appl. Phys 69(5), Mar. 1991; p. 2810-2814.

Cavailles, J.A. et al., *First Digital Optical Switch Based on InP/GaInAsP Double Heterostructure Waveguides*; Electronics Letters, vol. 27, No. 9, Apr. 25, 1991. p. 699-700.

Chen, R.T. et al., *Design and Manufacturing of WDM Devices*; Proceedings of SPIE vol. 3234.

Clemens, et al., *Wavelength-Adaptable Optical Phased Array in $SiO_2$-Si*, Photonics Technology Letters, Oct. 1995, vol. 7-No. 10, 1040-1041.

Dagli, N. et al., *Analysis of Rib Dielectric Waveguides*; IEEE Journal of Quantum Electronics, vol. QE-21, No. 4, Apr. 1985, p. 315-321.

Dagli, N. et al., *Theoretical and Experimental Study of the Analysis and Modeling of Integrated Optical Components*; IEEE Journal of Quantum electronics, vol. 24, No. 11, Nov. 1988; p. 2215-2226.

Deri, R.J., *Low-Loss GaAs/AlGaAs Waveguide Phase Modulator Using A W-shaped Index Profile*; Sep. 6, 1988.

Deri, R.J., et al., *Low-Loss Multiple Quantum Well GaInAs/InP Optical Waveguides*; Feb. 21, 1989.

Devaux, F. et al., *20Gbit/s Operation of a High-Efficiency InGaAsP/InGaAsP MQW Electroabsorption Modulator with 1.2-V Drive Voltage*; IEEE Photonics Technology Letters, vol. 5, No. 11, Nov. 1993, p. 1288-1290.

Doerr, C.R. et al., *Chirping Of The Waveguide Grating Router For Free-Spectral-Range Mode Selection in the Multifrequency Laser*, IEEE Photonics Technology Letters, Apr. 1996, vol. 8-No. 4, pp. 500-502.

Doerr, C.R. et al., *Chromatic Focal lane Displacement in the Parabolic Chirped Waveguide Grating Router*, May 1997, vol. 9-No. 5, pp. 625-627.

Dragone, c. *Efficient NxN Star Couplers Using Fourier Optics*, pp. 479-480, Mar. 1989, vol. 7-No. 3, Journal of Lightwave Technology.

Fischer, et al., *Singlemode Optical Switches Based on SOI Waveguides with Large Cross-Section*, Electronics Letters, Mar. 3, 1994, vol. 30-No. 5, pp. 406-408.

Fischer, K. et al, *Sensor Application Of SiON Integrated Optical Waveguides On Silicon*; Elevier Sequoia, 1992; p. 209-213.

Fish, G. et al., *Monolithic InP Optical Crossconnects: 4×4 and Beyond*, JWB2-1, p. 19-21.

Furuta, H. et al. *Novel Optical Waveguide For Integrated Optics*, Applied Optics, vol. 13, No. 2, Feb. 1974, p. 322-326.

Gini, E. et al., *Low Loss Self-Aligned Optical Waveguide Corner Mirrors in InGaAsP/InP*, We p. 2.22.

Goel, K. et al *Design Considerations for Low Switching Voltage Crossing Channel Switches*; Journal of Lightwave Technology, vol. 6, No. 6, Jun. 1988; p. 881-886.

Granestrand, P. et al., *Integrated Optics 4×4 Switch Matrix with Digital Optical Switches*; Electronics Letters, vol. 26, No. 1, Jan. 4, 1990; p. 4-5.

Himeno, A. et al., *Loss Measurement and Analysis of High-Silica Reflection Bending Optical Waveguides*, Journal of Lightwave Technology, Jan. 1988, vol. 6-No. 1, 41-46.

Hsu, K.Y. et al., *Photonics devices and Modules*, www.cc.nctu.edu.tw/~ctr/lee_mti/research_topic/photonic_devices_modules.htm, pp. 1-3.

Huang, T.C. et al., *Depletion Edge Translation Waveguide Crossing Optical Switch*; IEEE Photonics Technology Letters; vol. 1, No. 7, Jul. 1989, p. 168-170.

Hutcheson, L.D. et al., *Comparison of Bending Losses in Integrated Optical Circuits*; Optics Letters, vol. 5, No. 6, Jun. 1980, p. 360-362.

Inoue, H. et al, *Low Loss GaAs Optical Waveguides*, Journal of Lightwave Technology, vol. LT-3, No. 6, Dec. 1985; p. 204-209.

Irace, A. et al., *Fast Silicon-on-Silicon Optoelectronic Router Based on a BMFET Device*, Journal of Selected Topics in Quantum Electronics, Jan./Feb. 2000, vol. 6-No. 1, pp. 14-18.

Ito, F. et al., *Carrier-Injection-Type Optical Switch In GaAs With A 1.06-1.55 µm Wavelength Range*; Appl. Physics Letters, 54(2) Jan. 9, 1989; p. 134-136.

Jackman, N. et al., *Optical Cross Connects for Optical Networking*; Bell Labs Technical Journal, Jan.-Mar. 1999; p. 262-281.

Johnston, I.R., et al., *Silicon-Based Fabrication Process For Production Of Optical Waveguides*; IEE Proc-Optoelectron., vol. 143, No. 1, Feb. 1996, p. 37-40.

Kaenko, A. et al., *Athermal Silica-based Arrayed-waveguide Grating (AWG) Multiplexers with New Low Loss Groove Design*; TuO1-1, p. 204-206.

Kasahara, R. et al., *Low-Power Consumption Slica-Based 2×2 Thermooptic Switch Using Trenched Silicon Substrate*, IEEE Photonics Technology Letters, vol. 11, No. 9, Sep. 1999, p. 1132-1134.

Khan, M.N. et al., *Fabrication-Tolerant, Low-Loss, and High-Speed Digital Optical Switches in InGaAsP/InP Quantum Wells*; Proc 21st Eur.Conf.on Opt.Comm.(ECOC '95-Brussels), p. 103-106.

Khan, M.N. et al., *High-Speed Operation of Quantum Well Electron Transfer Digital Optical Switches*; p. 102-102c.

Kirihara, T. et al., *Lossless And Low Crosstalk 4×4 Optical Switch Array*; Electronics And Communications In Japan, Part 2, vol. 77, No. 11, 1994, p. 73-81.

Kirihara, T. et al., *Lossless and Low-Crosstalk Characteristics in an InP-Based 2×2 Optical Switch*, IEEE Photonics Technology Letters, vol. 5, No. 9 Sep. 1993, p. 1059-1061.

Kokubun, Y. et al., *Athermal Waveguides for Temperature-Independent Lightwave Devices*, Nov. 1993, 1297-1298, vol. 5-No. 11, IEEE Photonics Technology Letters.

Kokubun, Y. et al., *Temperature-Independent Narrowband Optical Filter at 1.3 µm Wavelength by an Athermal Waveguide*, 10th Oct. 1996, vol. 32-No. 21, Electronics Letters.

Kokubun, Y. et al., *Temperature-Independent Optical Filter at 1.55 µm Waveguide Using a Silica-Based Athermal Waveguide*, Feb. 19, 1998, vol. 34-No. 4, Electronics Letters.

Kokubun, Y. et al., *Three-Dimensional Athermal Waveguides for Temperature Independent Lightwave Devices*, 21st Jul. 1994, vol. 30-No. 15, Electronics Letters.

Kostrzewa, C. et al., *Tunable Polymer Optical Add/Drop Filter for Multiwavelength Networks*, Photonics Technology Letters, Nov. 1997, vol. 9-No. 11, 1487-1489.

Laakman, K. D. et al., *Waveguides: Characteristic Modes Of Hollow Rectangular Dielectric Waveguides*; Applied Optics, vol. 15, No. 5, May 1976; p. 1334-1340.

Lee, T.P. et al., $Al_xGa_{1-x}As$ *Double-Heterostructure Rib-Waveguide Injection Laser*, IEEE Journal of Quantum Electronics; vol. QE-11, No. 7, Jul. 1975; p. 432-435.

Liu, Y.L. et al., *Silicon 1×2 Digital Optical Switch Using Plasma Dispersion*; Electronics Letters, vol. 30, No. 2, Jan. 20, 1994; p. 130-131.

Mak, G. et al., *High-Speed Bulk InGaAsP-InP Electroabsorption Modulators with Bandwidth in Excess of 20 GHz*, IEEE Photonics Technology Letter, vol. 2, No. 10, Oct. 1990, p. 730-733.

Marcatili, E., *Improved Coupled-Mode Equations for Dielectric Guides*; IEEE Journal of Quantum Electronics, vol. QE-22, No. 6, Jun. 1986; p. 988-993.

Marcatili, E.A.J., *Bends in Optical Dielectric Guides*; The Bell System Technical Journal, Sep. 1969; p. 2103-2132.

Marcatili, E.A.J., *Dielectric Rectangular Waveguide and Directional Coupler for Integrated Optics*, The Bell System Technical Journal, Sep. 1969 p. 2071-2101.

Marcatili, E.A.J., *Slab-Coupled Waveguides*; The Bell System Technical Journal, Apr. 1974; American Telephone & Telegraph Company, vol. 53, No. 4, Apr. 1974.

Mirza, A.R. et al., *Silicon Wafer Bonding For MEMS Manufacturing*, Solid State Technology, Aug. 1999, p. 73-78.

Moerman, I. et al., *A Review on Fabrication Technologies for the Monolithic Integration of Tapers with III-V Semiconductor Devices*; IEEE Journal of Selected Topics in Quantum electronics, vol. 3, No. 6, Dec. 1997, p. 1308-1320.

Müller, G. et al., *First Low Loss InP/InGaAsP Optical Switch with Integrated Mode Transformers*; ThC12.10; p. 37-40.

Nayyer, J. et al., *Analysis of Reflection-Type Optical Switches with Intersecting Waveguides*, Journal of Lightwave Technology, vol. 6, No. 6, Jun. 1988; p. 1146-1152.

Negami, t. et al., *Guided-Wave Optical Wavelength Demultiplexer Using An Asymmetric Y Junction*; Appl. Phys. Lett. 54 (12), Mar. 20, 1989; p. 1080-1082.

Nelson, W. et al., *Optical Switching Expands Communications-Network Capacity*, Laser Focus World, Jun. 1994, p. 517-520.

Nelson, W.H. et al., *Wavelength-and Polarization-Independent Large Angle InP/InGaAsP Digital Optical Switches with Extinction Ratios Exceeding 20 dB*; IEEE Photonics Technology Letters, vol. 6, No. 11, Nov. 1994; p. 1332-1334.

Noda, Y. et al., *High-Speed Electroabsorption Modulator with Strip-Loaded GaInAsP Planar Waveguide*; Journal of Lightwave Technology, vol. LT-4, No. 10, Oct. 1986, p. 1445-1453.

Offrein, B.J. et al., *Resonant Coupler-Based Tunable Add-After-Drop Filter in Silicon-Oxynitride Technology for WDM Networks*, Journal of Selected Topics in Quantum Electronics, vol. 5-No. 5, 1400-1405.

Okamoto, K. et al., *Arrayed-Waveguide Grating Multiplexer With Flat Spectral Response*; Optics Letters, Jan. 1, 1995; vol. 20, No. 1; p. 43-45.

Okamoto, K. et al., *Flat Spectreal Response Arrayed-Waveguide Grating Multiplexer with Parabolic Waveguide Horns*, Electronics Letters Online, Jul. 15, 1996, No. 19961120, pp. 1661-1662.

Okayama, H. et al., *8×8 Ti:LiNbO₃ Waveguide Digital Optical Switch Matrix*; IEICE Trans. Commun.; vol. E77-B, No. 2; Feb. 1944; p. 204-208.

Okayama, H. et al., *Dynamic Wavelength Selective Add/Drop Node Comprising Tunable Gratings*, Electronics Letters Online, Apr. 10, 1997, No. 19970607.

Okayama, H. et al., *Reduction of Voltage-Length Product for Y-Branch Digital Optical Switch*, Journal of Lightwave Technology, vol. 11, No. 2, Feb. 1993; p. 379-387.

Okuno, M. et al., *Strictly Nonblocking 16×16 Matrix Switch Using Silica Based Planar Lightwave Circuits*, vol. 10, No. 266, Sep. 11, 1986.

Ooba, N. et al., *Athermal Silica-Based Arrayed-Waveguide Grating Multiplexer Using Bimetal Plate Temperature Compensator*, Electronics Letters, 12th Oct. 2000, vol. 36, No. 21, pp. 1800-1801.

Renaud, M. et al., *Compact Digital Optical Switches for Low Insertion Loss Large Switch Arrays on InP*; Proc. 21st Eur.Conf.on Opt. Comm. (ECOC '95-Brussels), p. 99-102.

Rickman, A.G. et al., *Silicon-on-Insulator Optical Rib Waveguide Loss and Mode Characteristics*, Journal of Lightwave Technology, Oct. 1994, vol. 12-No. 10, pp. 1771-1776.

Rolland, C. et al., *10 Gbit/s, 1.56 μm, Multiquantum Well InP/InGaAsP Mach-Zehnder Optical Modulator*, Electronics Letters, Mar. 4, 1993, vol. 29, No. 5, p. 471-472.

Santec Sales Brochure for year 2000 entitled "Optical Components".

Schauwecker, B. et al, *Small-Size Silicon-Oxynitride AWG Demultiplexer Operating Around 725 nm*, IEEE Photonics Technology Letters, vol. 12, No. 12, Dec. 2000.

Schlachetzki, A. *Monolithic IO-Technology-Modulators and Switches Based on InP*; SPIE vol. 651 Integrated Optical Circuit Engineering III (1986), p. 60-86.

Silberberg, Y. et al., *Digital Optical Switch*; Appl. Phys. Lett.; vol. 51, No. 16, Oct. 19, 1987, p. 152-154.

Smit, M.K., *New Focusing and Dispersive Planar Component Based on an Optical Phased Array*; Electronics Letters; Mar. 31, 1988, vol. 24, No. 7; p. 385-386.

Smith, S.D. et al., *CW Operation of Corner Cavity Semiconductor Lasers*; IEEE Photonics Technology Letters, vol. 5, No. 8, Aug. 1993, p. 876-879.

Sneh, A. et al., *Compact Low Crosstalk and Low Propagation Loss Quantum-Well Y-Branch Switches*; PDP 4-1-4-5.

Soole, J.B.D. et al., *Use of Multimode Interference Couplers to Broaden the Passband of Wavelength-Dispersive Integrated WDM Filters*; IEEE Photonics Technology Letters, vol. 8, No. 10, Oct. 1996; p. 1340-1342.

Stoll, L. et al., *1:8 Optical Matrix Switch on InP/InGaAsP with Integrated Mode Transformers*; Optical Switches and Modulators II, p. 531-534.

Stoll, L. et al., Compact and Polarization Independent Optical Switch on InP/InGaAsP; TuB7.2; p. 337-340.

Stutius, W. et al, *Silicon Nitride Films On Silicon For Optical Waveguides*, Applied Optics, vol. 16, No. 12, Dec. 1977, p. 303-307.

Sugie, T. et al., *1.3- μm Laser Diodes with a Butt-jointed Selectively Grown Spot-Size Converter*; ThB2-6, IOOC95, p. 52-53.

Tada, K. et al., *Bipolar Transistor Carrier-Injected Optical Modulator/Switch: Proposal and Analysis*, IEEE Electron Device Letters, vol. EDL-7, No. 11, Nov. 1986, p. 605-606.

Takada, et al., *Optical Spectrum analyzer using Cascaded AWG's with Different Channel Spacings*, Photonics Technology Letters, Jul. 1999, vol. 11, No. 7, pp. 863-864.

Takahashi, H. et al., *Arrayed Waveguide Grating for Wavelength Division Multi/Demultilexer with Nanometre Resolution*, PWG-NTT-7.

Takiguchi, K. et al, *Dispersion Compensation Using a Planar Lightwave Circuit Optical Equalizer*, Photonics Technology Letters, Apr. 1994, vol. 6, No. 4, pp. 561-564.

Tien, P.K. et al., *Formation of Light-Guiding Interconnections in an Integrated Optical Circuit by Composite Tapered-Film Coupling*; Applied Optics, vol. 12, No. 8, Aug. 1973; p. 1909-1916.

Toyoda et al., *Thermoplastic Switch and Wavelength Tunable Filter using Polymer Waveguides*, Abstract of paper presented at Opticomm 2001 on Aug. 22, 2001.

Treyz, G.V. et al., *Silicon Optical Modulators at 1.3 μm Based on Free-Carrier Absorption*; IEEE Electron Device Letters, vol. 12, No. 6, Jun. 1991; p. 276-278.

Tsuda, H. et al., *Performance Analysis of a Dispersion Compensator Using Arrayed-Waveguide Gratings*, Journal of Lightwave Technology, Aug. 2000, vol. 18-No. 8, pp. 1139-1147.

Tsude, H. et al., *Second- and Third-Order Dispersion Compensator Using a High-Resolution Arrayed Waveguide Grating*, IEEE Photonics Technology Letters, May 1999, vol. 11-No. 5, 569-571.

Vinchant et al, *InP 4×4 Digital-Optical-Switch Module For Multiwavelength Cross-Connect Applications*; OFC '95 Technical Digest, Thursday ThK2, p. 281-282.

Vinchant, J.F. et al., *First Polarisation insensitive 4×4 Switch matrix on InP with Digital Optical Switches*, TuB7.3, p. 341-344.

Vinchant, J.F. et al., *InP Digital Optical Switch: Key Element for Guided- Wave Photonic Switching*; IEE Proceedings-J, vol. 140, No. 5, Oct. 1993; p. 301-307.

Vinchant, J.F. et al., *Low Driving Voltage or Current Digital Optical Switch on InP for Multiwavelength System Applications*; Electronics Letters, vol. 28, No. 12, Jun. 4, 1992; p. 1135-1137.

Wakita, K. et al., *Long Wavelength Waveguide Multiple Quantum Well Optical Modulators*; IEEE Journal of Quantum Electronics, vol. QE-23, No. 12, Dec. 1987, p. 2210-2215.

Wanru, Z. et al., *Total Internal Reflection Optical Switch with Injection Region Isolated by Oxygen Ion Implantation*; p. 1-10.

Yamada, et al., *Cross Talk Reduction in a 10 GHz Spacing Arrayed-Waveguide Grating by Phase-Error Compensation*, Journal of Lightwave Technology, Mar. 1998, vol. 16-No. 3, pp. 364-371.

Yanagawa, H. et al., *Polarization-and Wavelength-Insensitive Guided-Wave Optical Switch with Semiconductor Y Junction*; Journal of Lightwave Technology, vol. 8, No. 8, Aug. 1990, p. 1192-1197.

Yu, S. et al., *High Speed All-Optical Packet Routing Using A Vertical Coupler Crosspoint Space Switch*.

Yu, S. et al., *Ultralow Cross-Talk, compact integrated optical crosspoint space switch arrays employing active InGaAs/InP Vertical Waveguide Couplers*, Integrated Optical Crosspoint Switch Arrays, Siyuan Yu et a, CPD24-2.

Zengerle, R. et al., *Tapered Twin Waveguides For Spot-Size Transformation In InP*; TheB2-5; IOOC 95; p. 50-51.

Zirngibl, M. et al., *Digitally Tunable Laser Based On The Integration Of A Waveguide Grating Multiplexer And An Optical Amplifier*, IEEE Photonics Technology Letters, Apr. 1994, vol. 6-No. 4, pp. 516-517.

Zucker, J.E. et al., *Strained Quantum Wells for Polarization-Independent Electrooptic Waveguide Switches*, Journal of Lightwave Technology, vol. 10, No. 12, Dec. 1992, p. 1926-1930.

\* cited by examiner

BITSTREAM DATA REDUCTION CODING BY APPLYING PREDICTION

CROSS-REFERENCE TO RELATED APPLICATIONS

This is a continuation of U.S. patent application Ser. No. 09/726,764, filed Nov. 30, 2000, now U.S. Pat. No. 6,535,845, which was a continuation of U.S. patent application Ser. No. 08/966,375, filed Nov. 7, 1997 now U.S. Pat. No. 6,289,306.

BACKGROUND OF THE INVENTION

1. Field of the Invention

The invention relates to a data processing apparatus for data processing an audio signal, to a data processing method, a transmitter comprising the data processing apparatus, a transmitter in the form of a recording apparatus, a record carrier, to second data processing apparatus for reconverting an input signal into a replica of the audio signal, to a receiver comprising the second data processing apparatus, to a receiver in the form of a reproducing apparatus and to a transmission signal comprising a data compressed residual bitstream signal.

2. Description of the Related Art

Data processing an audio signal is well-known in the art. Reference is made in this respect to European Patent Application No. EP-A 402,973, document D1 in the List of Related Documents. The document describes a sub-band coder, in which an audio signal is A/D converted with a specific sampling frequency, such as, 44.1 kHz, and the resulting samples in the form of, e.g., 24-bit words of the audio signal, are supplied to a sub-band splitter filter. The sub-band splitter filter splits the wideband digital audio signal into a plurality of relatively narrow band sub-band signals. Using a psycho-acoustic model, a masked threshold is derived and blocks of samples of the sub-band signals are subsequently quantized with a specific number of bits per sample for each block of the sub-band signals, in response to said masked threshold, resulting in a significant data compression of the audio signal to be transmitted. The data compression carried out is based on 'throwing away' those components in the audio signal that are inaudible, and is, thus, a lossy compression method. The data compression described in document D1 is a rather intelligent data compression method and requires a substantial number of gates or instructions, when realized in hardware or software, respectively, so that it is expensive. Moreover, the subsequent expansion apparatus also requires a substantial number of gates or instructions, when realized in hardware or software, respectively.

SUMMARY OF THE INVENTION

The invention aims at providing a data processing apparatus for processing an audio signal such that it can be data compressed by a lossless coder in a relatively simple way. Further, the invention aims at providing a corresponding data processing apparatus for reconverting the processed bitstream signal into a replica of the audio signal.

The data processing apparatus in accordance with the invention comprises input means for receiving the audio signal, conversion means for carrying out a conversion on the audio signal so as to obtain a 1-bit bitstream signal, the conversion means comprising sigma-delta modulator means, prediction means for carrying out a prediction step on a signal so as to obtain a predicted bitstream signal, signal combination means for combining the bitstream signal and the predicted bitstream signal so as to obtain a residual bitstream signal, and output means for supplying the residual bitstream signal.

The invention is based on the following recognition. Bitstream signals take up a considerable amount of capacity. To illustrate this: in a current proposal for a new standard for an optical audio disk, the disk will contain two channels of bitstream converted audio signals, sampled at 64·fs, where fs=44.1 kHz. This corresponds to a rate four times higher than a current CD audio disk. As discussed in an earlier filed but not yet published European Patent Application No. 96202807.2, document D7 in the List of Related Documents that can be found at the end of this description, already low complexity lossless coding algorithms, such as, fixed Huffman table coding, are able to reduce this capacity to a certain extent. Experiments have revealed that even higher lossless compression ratios can be obtained using more sophisticated, more complex algorithms, such as Lempel-Ziv.

Mainly in audio/speech coding, linear prediction is known to be a powerful technique. By removing redundancy from a speech/audio signal prior to quantization, the entropy of signal after quantization can be significantly reduced. The signals at the input and output of a predictor are either in a floating point or a multi-bit representation.

In lossless coding of bitstream signals, the complexity of the algorithm, especially at the decoder side, is of importance. However, generally, the performance of the lossless coding algorithm is closely related to its complexity.

In accordance with the invention, prediction is used on bitstream signals, i.e., signals with only two different representation symbols, either '0' or '1'. This has the advantage of an increase of lossless compression performance, for only a marginal extra complexity.

Experiments have revealed that already a third-order prediction has considerable effect on the statistics of the resulting signal. By means of prediction, as a preprocessing step, prior to data compression, the probability of a '1'-bit can be brought down from 50% to about 20%. The effect of this is that the output of the apparatus, in accordance with the invention, contains long runs of 'zeroes', which can be exploited by simple Huffman coding or run-length coding.

The audio signal can be applied in analog form or in digital form. When A/D converting, in accordance with the invention, an analog audio signal with a 1-bit A/D converter (also named bitstream converter or sigma-delta modulator), the audio signal to be A/D converted is sampled with a frequency which is generally a multiple of the frequency of 44.1 kHz or 48 kHz. The output signal of the 1-bit A/D converter is a binary signal, named bitstream signal. When the audio signal is supplied in digital form, sampled at, e.g., 44.1 kHz, the samples being expressed in, e.g., 16 bits per sample, this digital audio signal is over-sampled with a frequency which is, again, a multiple of this sampling frequency of 44.1 kHz (or 48 kHz), which results in the 1-bit bitstream signal.

Converting an audio signal into a 1-bit bitstream signal has a number of advantages. Bitstream conversion is a high quality encoding method, with the possibility of a high quality decoding or a low quality decoding with the further advantage of a simpler decoding circuit. Reference is made, in this respect, to the publications 'A digital decimating filter for analog-to-digital conversion of hi-fi audio signals', by J. J. van der Kam, document D2 in the List of Related Documents, and 'A higher order topology for interpolative modulators for oversampling A/D converters', by Kirk C. H. Chao et al, document D3 in the List of Related Documents.

1-bit D/A converters are used in CD players, for example, to reconvert the bitstream audio signal into an analog audio signal. The audio signal recorded on a CD disk is, however, not data compressed, prior to recording on the disk.

It is well known in the art that the resulting bitstream signal of the 1-bit A/D converter is, roughly said, a random signal which has a 'noisy-like' frequency spectrum. Such types of signals are hard to data compress.

Surprisingly, however, it was established that by applying a prediction step, prior to data compression, e.g., using a lossless coder, a significant data reduction could be obtained, in spite of the noisy character of the bitstream signal from the 1-bit A/D converter.

BRIEF DESCRIPTION OF THE DRAWINGS

These and other aspects of the invention will be apparent from and elucidated further with reference to the embodiments described in the following figure description, in which.

DESCRIPTION OF THE PREFERRED EMBODIMENTS

Figure 1:
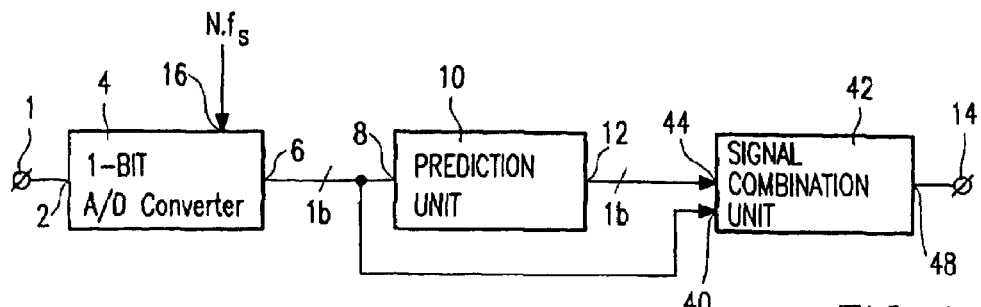
FIG. 1 shows an embodiment of the data processing apparatus.

FIG. 1 shows an embodiment of the data processing apparatus in accordance with the invention, comprising an input terminal 1 for receiving the audio signal. In the present example, the audio signal is an analog audio signal. The input terminal 1 is coupled to an input 2 of a 1-bit A/D converter 4, also called a sigma-delta modulator. An output 6 of the 1-bit A/D converter 4 is coupled to an input 8 of a prediction unit 10, as well as to a first input 40 of a signal combination unit 42. An output 12 of the prediction unit 10 is coupled to a second input 44 of the signal combination unit 42, an output 48 of which is coupled to an output terminal 14.

The 1-bit A/D converter 4 carries out a 1-bit A/D conversion on the audio signal to form a bitstream signal which is supplied to the output 6. To that end, the A/D converter 4 receives a sampling frequency equal to N·fs via an input 16. fs is a frequency equal to, e.g., 32 kHz, 44.1 kHz or 48 kHz, and N is a large number, such as 64. The audio signal is sampled in the A/D converter 4 with a sampling frequency of, e.g., 2.8224 MHz (64×44.1 kHz). The bitstream signal appearing at the output 6 of the A/D converter thus has a bit-rate of 2.8224 MHz.

The prediction means 10 carries out a prediction step on the bitstream signal applied to its input 8 to form a predicted bitstream signal at its output 12. The signal combination means 42 combines the bitstream signal applied to its input 40 and the predicted bitstream signal applied to its input 44 to form a residue bitstream signal which is supplied to its output 14.

Figure 17A:
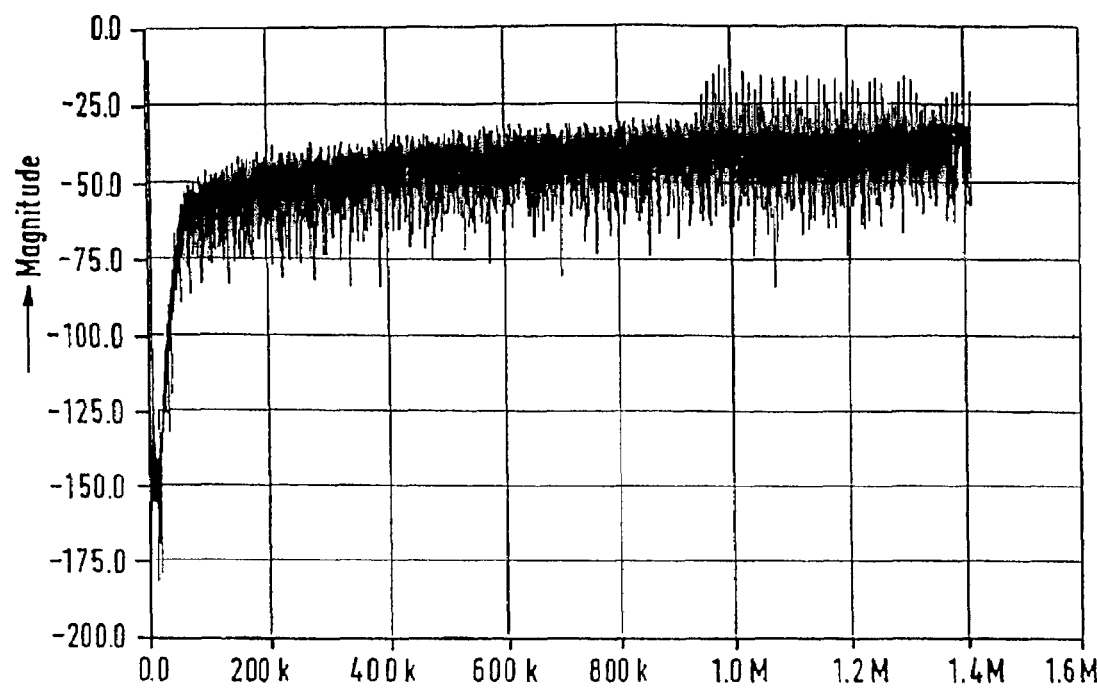
FIG. 17A shows the frequency spectrum of the output signal of the 1-bit A/D converter of FIG. 1.
Figure 17B:
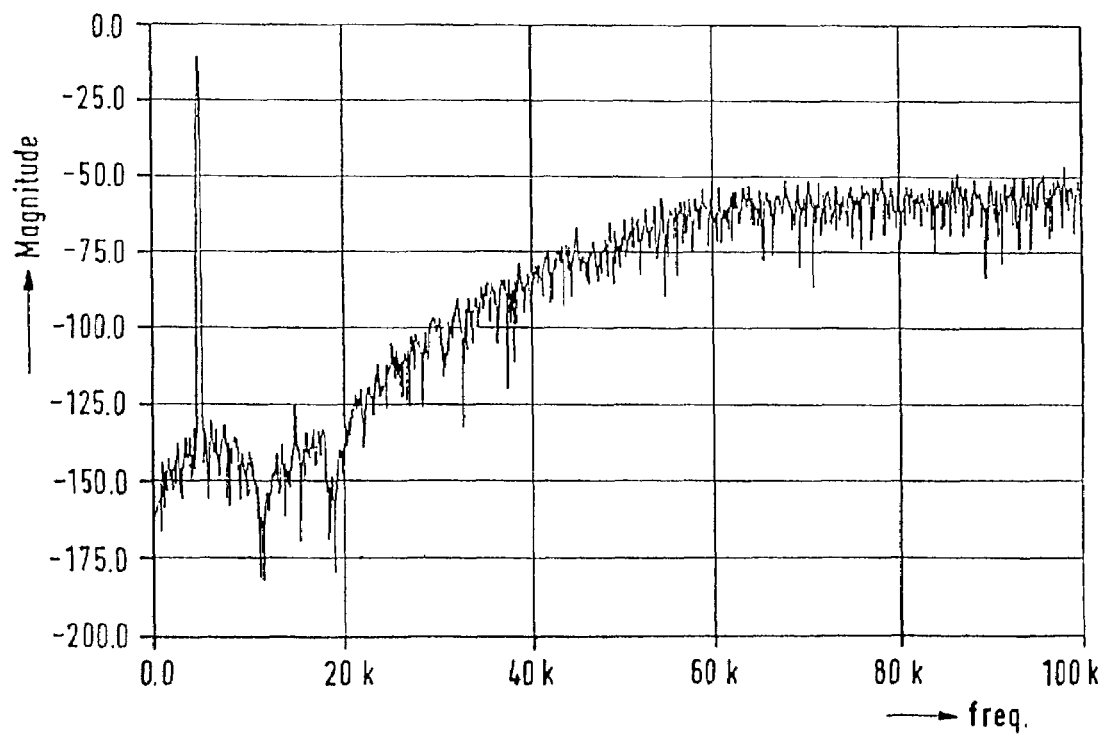
FIG. 17B shows the frequency spectrum of the same output signal in a smaller frequency range.

FIG. 17A shows a frequency spectrum of the bitstream signal present at the output 6 of the A/D converter 4, for an input signal in the form of a 5 kHz sinusoid, sampled with a sampling frequency of 2.8224 MHz. The spectrum thus shows frequencies between 0 Hz and 1.4 MHz. FIG. 17B shows part of the spectrum shown in FIG. 17A, namely, that part between 0 Hz and 100 kHz, so as to more clearly show the 5 kHz sinusoid contained in the bitstream signal. Clearly visible is the noise-like character of the bitstream signal, especially in the higher frequency region, which seems to imply that carrying out a prediction step on this signal, with a subsequent signal combination of the predicted version of the bitstream signal and the bitstream signal to form said residual signal, will not result in a substantial amount decrease in entropy of the residual signal, such decrease of entropy of the residual signal, compared to the input signal of the prediction unit being the general aim of a prediction unit.

Contrary to this, investigations have made clear that a significant decrease in entropy of the residual bitstream signal can be obtained by carrying out a prediction step, in spite of the noisy-like character of the bitstream signal.

The prediction unit 10 can have any form, and could comprise a FIR filter or an IIR filter, where the coefficients of the filter are chosen (or derived) such that the output signal of the prediction unit 10 is the predicted version of the bitstream signal.

Figure 2:
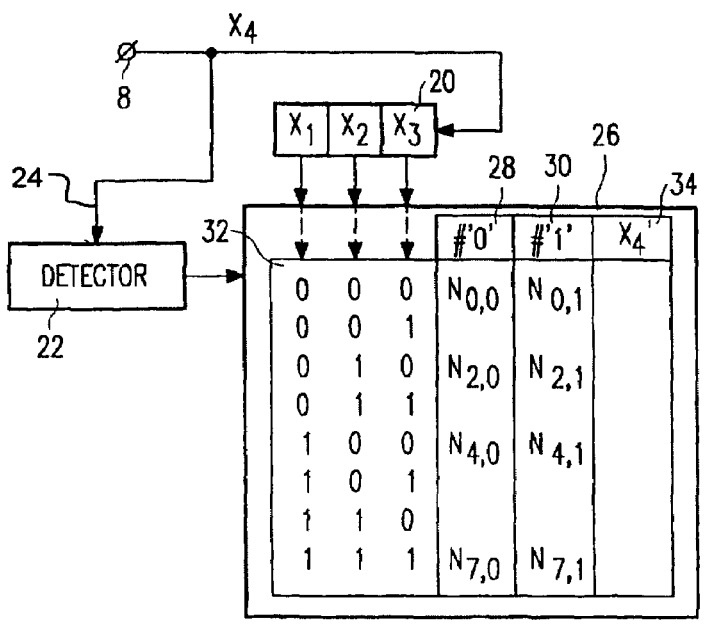
FIG. 2 shows part of an embodiment of a prediction unit for use in the apparatus of FIG. 1.

Another embodiment of the prediction unit 10 will be further explained with reference to FIGS. 2 and 3. FIG. 2 shows a part of the prediction unit 10, which comprises a 3-bit shift register 20 having an input coupled to the input 8 of the prediction unit 10. Upon the application of three clock pulses (not shown) to the shift register 20, three subsequent bits x1, x2, x3 of the bitstream signal applied to the input 8 are shifted into the shift register 20. The prediction unit 10 includes a detector 22 having an input 24 coupled to the input 8 of the prediction unit 10. The detector 22 detects the bit value of the next bit x4 directly following the three subsequent bits x1, x2, x3 in the bitstream signal. Further, the prediction unit 10 includes a counter 26 for counting the number of times that a '0' bit follows a specific 3-bit bit sequence x1, x2, x3 and the number of times that a '1' bit follows that same specific 3-bit bit sequence. This is done for all the eight possible 3-bit bit sequences x1, x2, x3.

Explained in a different way. Assume that the 3-bit sequence '100' is stored in the shift register 20 and that the detector 24 detects the next bit x4 to be '0'. As a result, the number N4,0 in the column 28 is increased by one. Upon the next clock pulse applied to the shift register 20, the 3-bit word stored in the shift register 20 now equals '000'. Assume that the next bit x4 now equals '1'. As a result, the number N0,1 in the column 30 is increased by one.

This procedure is continued for a relatively large portion of the bitstream signal. When the portion of the bitstream signal has been processed in this way, the columns 28 and 29 are filled with numbers Ni, 0, Ni, 1, which indicate the number of occurrences of a '0'-bit or '1'-bit, respectively, as the next bit following the i-th 3-bit sequence given in column 32, where i runs from 0 to 7 in the present example.

Next, a predicted binary value x4' is derived from the numbers in the columns 28 and 30 for each of the 3-bit sequences x1, x2, x3 in the column 32, by taking that binary value (either '0' or '1') that resulted in the highest of the count number Ni, 0 and Ni,1 for the i-th bit sequence in column 32. As an example, if N4,0 equals 78 and N4,1 equals 532, the predicted bit x4' in response to the occurrence of the 3-bit bit sequence '100' is chosen equal to '1'. A conversion table can thus be derived comprising the columns 32 and 34, so that for each of the eight possible 3-bit sequences stored in the shift register 20, a corresponding predicted bit x4' can be generated. In the situation where equal count values Ni,0 and Ni,1 have been derived for a 3-bit bit sequence i, one can choose one of the two binary values '0' or '1' at random as the value for the predicted bit.

It should be noted here that two counters for each 3-bit bit combination are used to count the numbers of 'zeroes' and 'ones' following said 3-bit bit combination. In spite of this, one could use only one counter which is capable of 'counting up' upon the occurrence of a 'zero' bit following the 3-bit bit combination, and 'counting down' in response to the occurrence of a 'one' bit following the 3-bit bit combination. If the count value at the end of the test procedure is higher than at the beginning of the test procedure, the predicted bit will be chosen 'zero'. If the count value appears to be lower than the count value at the beginning of the test procedure, the predicted bit will be chosen 'one'.

If the signal to be processed is substantially time invariant, it may occur that, upon deriving a conversion table from a next portion of the bitstream signal, the same predicted values x4' will be obtained. In such case, it suffices to derive the conversion table once. For bitstream signals having varying properties, it may be required to, each time, derive the conversion table from a subsequent portion of the bitstream signal and to predict that portion of the bitstream using its own derived conversion table.

Figure 3:
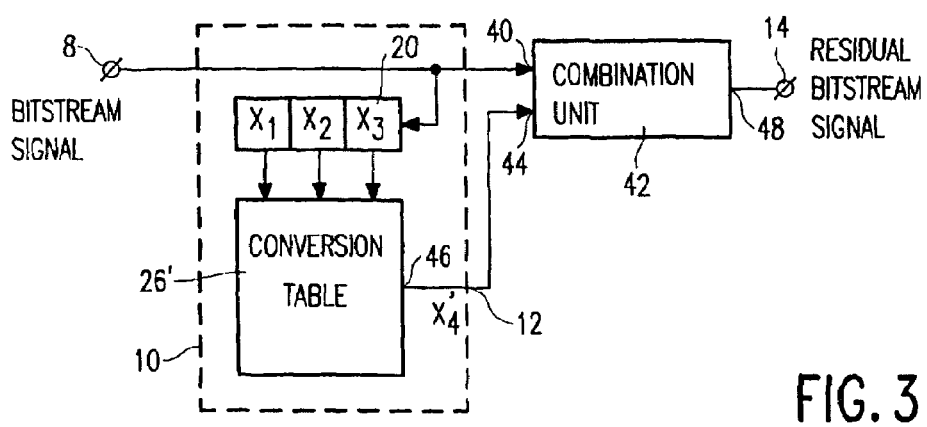
FIG. 3 shows an embodiment of the prediction unit and the signal combination unit incorporated in the data processing apparatus.

FIG. 3 shows a further elaborated version of the prediction unit 10 together with the signal combination unit 42. The input 8 of the prediction unit 10 is coupled to a first input 40 of a signal combination unit 42. An output 46 of the conversion means 26', which comprises the conversion table derived in the way explained above with reference to FIG. 2, is coupled to a second input 44 of the signal combination unit 42, an output 48 of which is coupled to the output 14 of the data processing apparatus. The signal combination unit 42 can be in the form of an EXOR, but the combination unit 42 may be of a different construction, such as, an EXNOR.

In response to a 3-bit bit sequence x1, x2, x3 stored in the shift register 20, the conversion unit 26' supplies the bit x4' at its output 46. This bit x4' is a prediction of the bit x4 present at the inputs of the shift register 20 and the combination unit 42. The combination unit 42 combines the bits x4 and x4' so as to obtain a residual bit. Upon a subsequent clock signal (not shown), the bit x4, present at the input of the shift register 20, is shifted into the shift register 20, so that a new 3-bit bit sequence is stored in the shift register 20. The conversion unit 26' generates a new prediction bit x4' in response to this new 3-bit bit sequence stored in the shift register 20. The signal combination unit 42 combines this new prediction bit x4' with the new bit x4 now present at the input 40 so as to form a new residual bit. In this way, a residual bitstream signal is obtained.

Assume that the combination unit 42 is an EXOR, the residual signal has the following property. Assume that both the bits x4 and x4' are the same, that is, either '0' or '1'. The residual bit supplied by the EXOR is '0'. Assume now that the bits x4 and x4' are not equal to each other. As a result, a '1' bit is generated as a residual bit by the EXOR 42. The occurrence of the '1' bits in the residual signal are thus a measure for the errors between the predicted bitstream signal applied to the input 44 of the combination unit 42 and the bitstream signal applied to the input 40.

Figure 4:
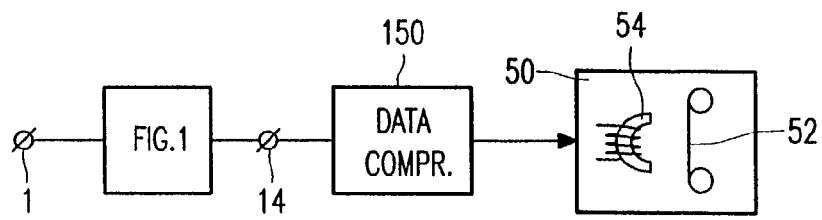
FIG. 4 shows the data processing apparatus of FIG. 1 incorporated in a recording apparatus for recording the residual bitstream signal on a record carrier.

FIG. 4 shows an embodiment of a recording apparatus comprising the data processing apparatus shown in FIG. 1, which may include the prediction unit shown in FIG. 3. The recording apparatus further comprises a data compression unit 150 for data compressing the residual bitstream signal into a data-compressed residual bitstream signal, and a write unit 50 for writing the data-compressed residual bitstream signal in a track on the record carrier 52. In the present example, the record carrier 52 is a magnetic record carrier, so that the write unit 50 comprises at least one magnetic head 54 for writing the residual bitstream signal in the record carrier 52. The record carrier may, however, be an optical record carrier, such as a CD disk or a DVD disk.

Figure 5:
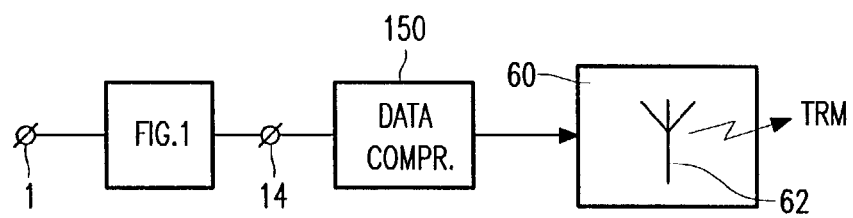
FIG. 5 shows the data processing apparatus incorporated in a transmission apparatus for transmitting the residual bitstream signal via a transmission medium.

FIG. 5 shows an embodiment of a transmitter for transmitting an audio signal via a transmission medium TRM, comprising the data processing apparatus as shown in FIG. 1, which may include the prediction unit shown in FIG. 3. The transmitter, again, comprises the data compression unit 150, and further comprises a transmission unit 60 for applying the data-compressed residual bitstream signal to the transmission medium TRM. The transmission unit 60 may comprise an antenna 62.

Figure 6:
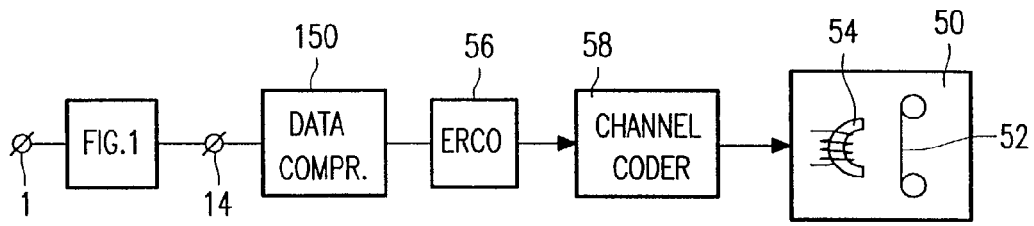
FIG. 6 shows a further embodiment of the recording apparatus, further provided with an error correction encoder and a channel encoder.

Transmission via a transmission medium, such as a radio frequency link or a record carrier, generally requires error correction encoding and channel encoding to be carried out on the data compressed residual signal to be transmitted. FIG. 6 shows such signal processing steps carried out on the data compressed residual signal for the recording arrangement of FIG. 4. The recording arrangement of FIG. 6 therefore comprises an error correction encoder 56, well known in the art, and a channel encoder 58, also well known in the art.

It has been said above that, in some applications, it suffices to use a fixed conversion table to process the bitstream signal. Upon reconverting the residual bitstream signal into a replica of the original bitstream signal, also a fixed conversion table suffices. In an application where, for subsequent portions of the bitstream signal, each time, a corresponding conversion table needs to be determined, to generate the residual bitstream signal, it will be required to use the same conversion tables for the portions in question upon reconverting the residual bitstream signal into the replica of the original bitstream signal. In such situation, it may be required to transmit side information representative of the conversion tables used for the various subsequent portions together with the residual signal so as to enable the reconversion upon reception.

As a further example, if it appears that it suffices to use only two conversion tables in the processing apparatus of FIG. 1, such side information could simply be a selection signal, selecting one of the two conversion tables. A corresponding reconversion apparatus could comprise the two conversion tables as well, and the selection signal could be used to select one of the two conversion tables so as to reconvert the residual bitstream signal into the replica of the original bitstream signal.

It should however be noted that when having derived a conversion table for a portion of the bitstream signal, it is not absolutely necessary to transmit side information corresponding to this conversion table to a reconverter apparatus. The reconverter apparatus may generate the conversion table by itself. The prediction unit in the reconversion apparatus will have a low prediction accuracy in the beginning, but will 'learn' itself so as to obtain a prediction conversion table, which will be substantially identical to the conversion table used in the transmitter apparatus.

Figure 7:
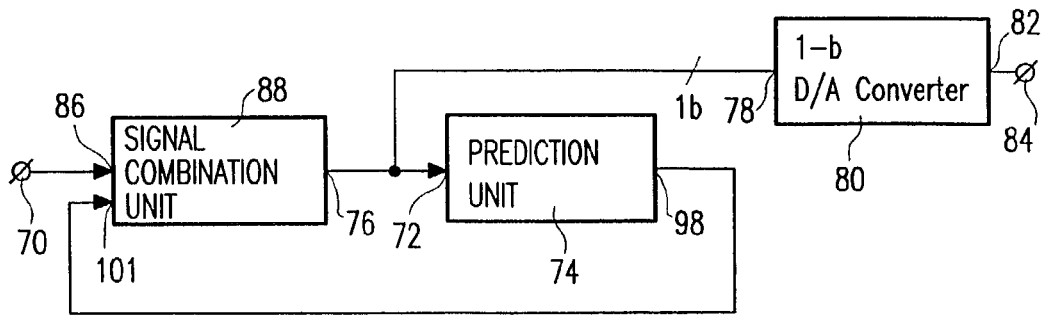
FIG. 7 shows an embodiment of another data processing apparatus for reconverting the residual bitstream signal into a replica of the original audio signal.

FIG. 7 shows a schematic embodiment of a second data processing apparatus in accordance with the invention, which is capable of reconverting the residual bitstream signal into the replica of the original bitstream signal. The apparatus has an input terminal 70 for receiving the residual bitstream signal, as supplied by the data processing apparatus of FIG. 1. The input terminal 70 is coupled to a first input 86 of a signal combination unit 88, which has an output 76 coupled to an input 72 of a prediction unit 74 as well as to an input 78 of a 1-bit D/A converter 80. An output 98 of the prediction unit 74 is coupled to a second input 101 of the signal combination unit 88. An output 82 of the D/A converter 80 is coupled to an output terminal 84.

The apparatus of FIG. 7 receives the residual bitstream via its input 70, which is supplied to the input 86 of the signal combination unit 88. The signal combination unit 88 combines the residue bitstream signal received via its input 86 with a predicted bitstream signal received via its input 101 to form a reconverted bitstream signal, and to supply the reconverted bitstream signal to its output 76. The prediction unit 74 carries out a prediction step on the reconverted bitstream signal to form said predicted bitstream signal at its output 98. The D/A converter unit 80 carries out a D/A conversion on the reconverted bitstream signal to form the replica of the original audio signal, which is supplied to the output terminal 84.

The prediction unit 74 can have any form, and could comprise a FIR filter or an IIR filter, where the coefficients of the filter are chosen (or derived) such that the output signal of the prediction unit 74 is the predicted version of the bitstream signal.

Figure 8:
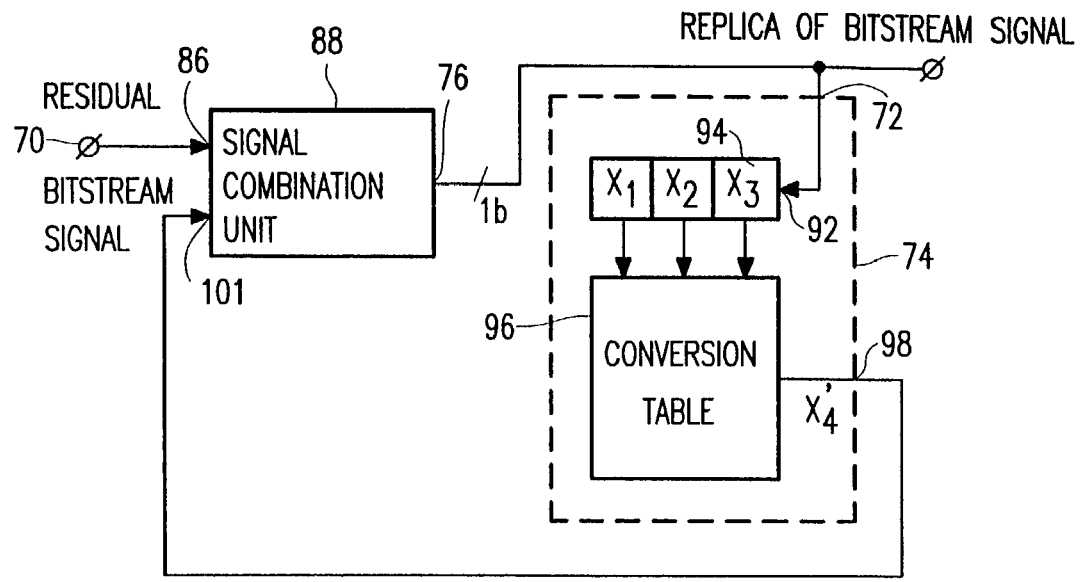
FIG. 8 shows an embodiment of the signal combination unit and the prediction unit incorporated in the apparatus of FIG. 7.

Another embodiment of the prediction unit 74 will be further explained with reference to FIG. 8. The input 72 of the prediction unit 74 is coupled to an input 92 of a 3-bit shift register 94. The three outputs of the three bit positions in the shift register 94 are coupled to corresponding inputs of a conversion unit 96. The conversion unit 96 comprises the conversion table discussed and explained above with reference to FIGS. 2 and 3. An output 98 of the conversion unit 96 is coupled to a second input 101 of the signal combination unit 88. The signal combination unit 88 can be in the form of an EXOR, but the combination unit 88 may be of a different construction, such as an EXNOR. It will be clear that if the signal combination unit 42 of FIG. 3 is an EXOR, the signal combination unit 88 of FIG. 8 must be an EXOR as well, in order to regenerate a replica of the original bitstream signal.

In response to a 3-bit bit sequence x1, x2, x3 stored in the shift register 94, the conversion unit 96 supplies the bit x4' at its output 98, in the way explained above with reference to the FIGS. 2 and 3. This bit x4' is a prediction of the bit x4 that will be supplied upon the next clock pulse by the combination unit 88 and stored as the new bit x3 in the most right storage position of the shift register 94. The residual bit present at the input 86 of the combination unit 88 is combined with the predicted bit x4' so as to obtain the replica of the original bit x4 in the original bitstream signal. When the residual bit is '0', which meant that a correct prediction was carried out in the apparatus of FIGS. 1 and 3, the combination of the residual bit with the predicted bit x4' results in the bit value of the bit x4' to appear at the output 90 of the combination unit 88. When the residual bit is '1', which meant that an incorrect prediction was carried out in the apparatus of FIGS. 1 and 3, the combination of the residual bit with the predicted bit x4' results in the inverse bit value of the bit x4' to appear at the output 90 of the combination unit 88. In both cases, a correct replica of the bit x4 will appear at the output 76 of the combination unit 88.

Upon a subsequent clock signal (not shown), the bit x4 present at the input of the shift register 94 is shifted into the shift register 94, so that a new 3-bit bit sequence is stored in the shift register 94. The conversion unit 96 generates a new prediction bit x4' in response to this new 3-bit bit sequence stored in the shift register 94. The signal combination unit 88 combines this new prediction bit x4' with the next residual bit in the residual bitstream signal applied to the input 86 so as to form a replica of the next bit x4 in the bitstream signal. In this way, the replica of the bitstream signal is obtained.

Figure 9:
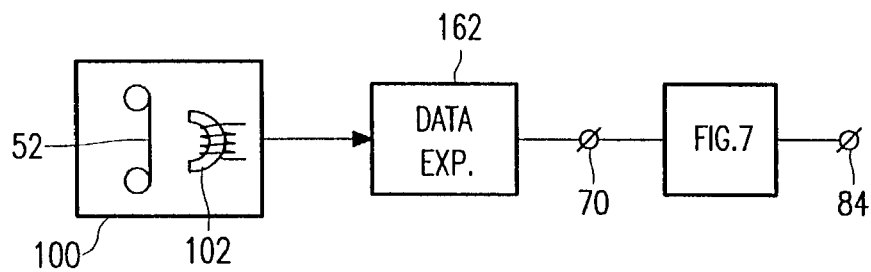
FIG. 9 shows the data processing apparatus of FIG. 7 incorporated in a reproducing apparatus for reproducing the residual bitstream signal from a record carrier.

FIG. 9 shows the data processing apparatus of FIG. 7 incorporated in a reproduction apparatus. The reproducing apparatus further comprises a data expansion unit 162 for data expanding the data compressed residual bitstream signal to form a replica of the original residual bitstream signal, and a read unit 100 for reading the data compressed residual bitstream signal from a track on the record carrier 52. In the present example, the record carrier 52 is a magnetic record carrier, as such, the read unit 100 comprises at least one magnetic head 102 for reading the data compressed residual bitstream signal from the record carrier 52. The record carrier may, however, be an optical record carrier, such as, a CD disk or a DVD disk.

Figure 10:
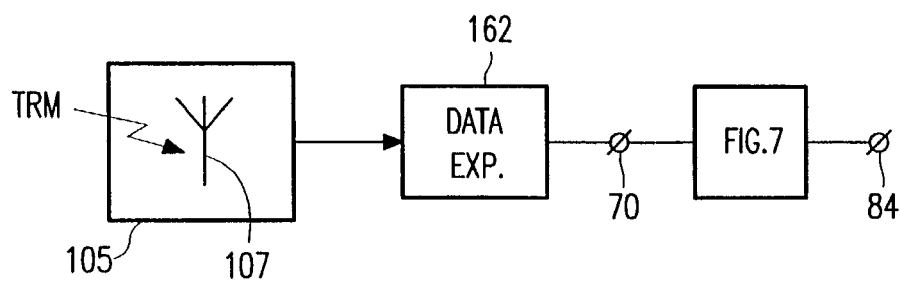
FIG. 10 shows the data processing apparatus of FIG. 7 incorporated in a receiving apparatus for receiving the residual bitstream signal from a transmission medium.

FIG. 10 shows an embodiment of a receiver for receiving an audio signal via a transmission medium TRM, comprising the data processing apparatus as shown in FIG. 7. The receiver further comprises the data expansion unit 162 and a receiving unit 105 for receiving the data compressed residual bitstream signal from the transmission medium TRM. The receiving unit 105 may also comprise an antenna 107.

Figure 11:
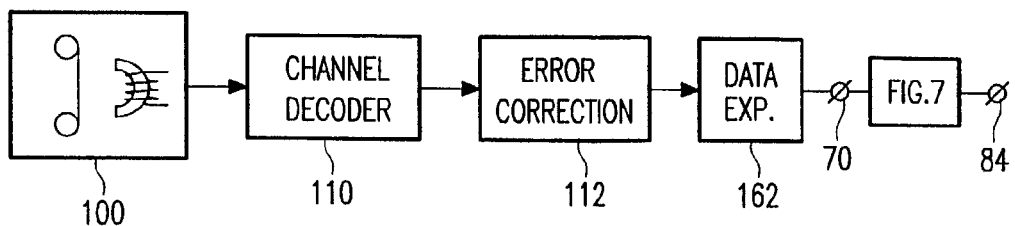
FIG. 11 shows a further embodiment of the reproducing apparatus, further provided with a channel decoder and an error correction unit.

As has been explained above, transmission via a transmission medium, such as a radio frequency link or a record carrier, generally requires error correction encoding and channel encoding to be carried out on the data compressed residual signal to be transmitted, so that a corresponding channel decoding and error correction can be carried out upon reception. FIG. 11 shows the signal processing steps of channel decoding and error correction carried out on the received signal, received by the reading means 100 for the reproducing arrangement of FIG. 9. The reproducing arrangement of FIG. 11 therefore comprises a channel decoder 110, well known in the art, and an error correction unit 112, also well known in the art, so as to obtain a replica of the data compressed residual bitstream signal.

It has also been said above that, in some applications, it suffices to use a fixed conversion table to process the bitstream signal in the apparatus of FIGS. 1 and 3. Upon reconverting the residual bitstream signal into a replica of the original bitstream signal, also a fixed conversion table suffices, so that no side information needs to be transmitted to the processing apparatus of FIGS. 7 and 8. In an application where, for subsequent portions of the bitstream signal, each time, a corresponding conversion table needs to be determined in the apparatus of FIGS. 1 and 3, to generate the residual bitstream signal, it will be required to use the same conversion tables for the portions in question upon reconverting the residual bitstream signal into the replica of the original bitstream signal in the apparatus of FIGS. 7 and 8. In such situation, it will be required to transmit side information representative of the conversion tables used for the various subsequent portions, together with the residual signal so as to enable reconversion upon reception. As an example, this side information thus needs to be recorded on the record carrier 52, such as in the application where the apparatus of FIGS. 1 and 3 is accommodated in a recording apparatus and the apparatus of FIGS. 7 and 8 is incorporated in a reproducing apparatus of FIG. 9 or 11, and be reproduced from said record carrier upon reproduction.

If it appears that it suffices to use only two conversion tables in the processing apparatus of FIG. 1, such side information could simply be a selection signal, selecting one of the two conversion tables. A corresponding reconversion apparatus could comprise the two conversion tables as well, and the selection signal could be used to select one of the two conversion tables so as to reconvert the residual bitstream signal into the replica of the original bitstream signal.

The embodiments described above are based on the prediction of 1 bit (x4') following a sequence of three subsequent bits (x1, x2, x3) in the bitstream signal. In general, the prediction unit can be capable of predicting from n subsequent bits in the bitstream signal m prediction bits, said m prediction bits being predicted versions of m subsequent bits in the bitstream signal following said n subsequent bits in the bitstream signal, where n and m are integers larger than zero.

Figure 12:
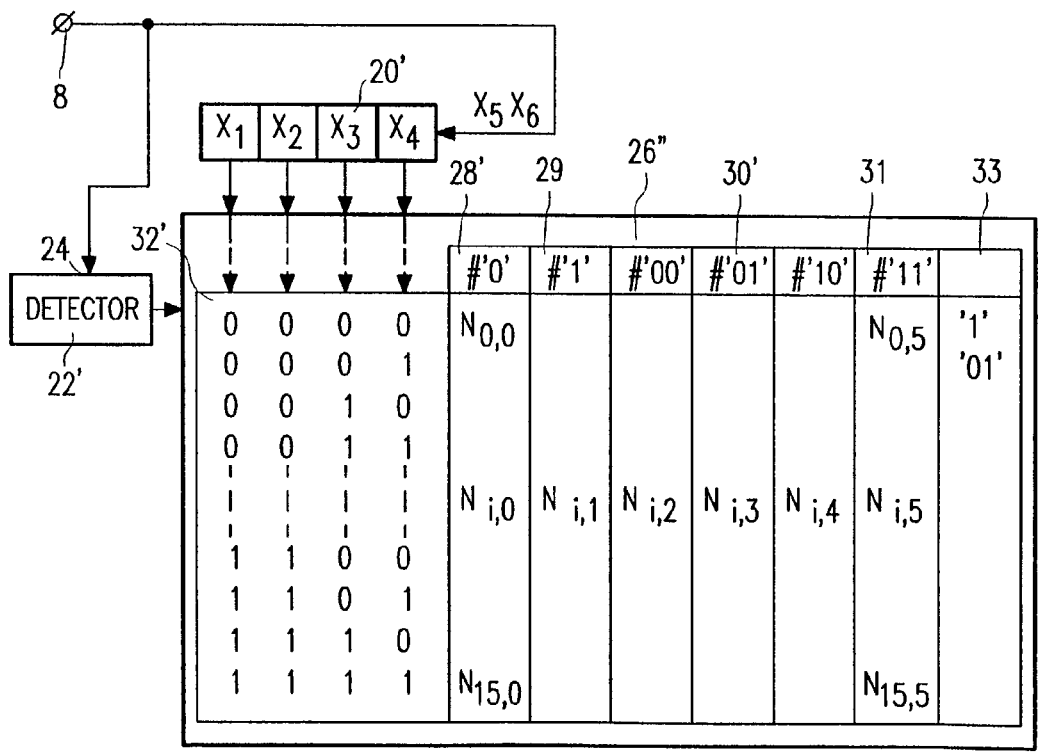
FIG. 12 shows the derivation of a conversion table for another embodiment of the prediction unit in the apparatus of FIG. 1.

FIG. 12 shows an example how to derive a conversion table which is capable of predicting one or two prediction bits from a sequence of four consecutive bits x1, x2, x3, x4 in the bitstream signal. FIG. 12 shows a part of another prediction unit 10', which comprises a 4-bit shift register 20' having an input coupled to the input 8 of the prediction unit 10'. Upon the application of four clock pulses (not shown) to the shift register 20', four subsequent bits x1, x2, x3, x4 of the bitstream signal applied to the input 8 are shifted into the shift register 20'. The prediction unit 10' includes a detector 22' having an input 24 coupled to the input 8 of the prediction unit 10'. The detector 22' detects the bit value of the next two bits x5, x6 directly following the four subsequent bits x1, x2, x3, x4 in the bitstream signal. Further, a counter 26" is present which counts the number of times that a '0' bit follows a specific 4-bit bit sequence x1, x2, x3, x4, the number of times that a '1' bit follows that same specific 4-bit bit sequence, the number of times that a 2-bit bit sequence '00' follows that same specific 4-bit bit sequence x1, x2, x3, x4, the number of times that a 2-bit bit sequence '01' follows that same specific 4-bit bit sequence, the number of times that a 2-bit bit sequence '10' follows that same specific 4-bit bit sequence x1, x2, x3, x4, and the number of times that a 2-bit bit sequence '11' follows that same specific 4-bit bit sequence. It should be noted here, that the 2-bit bit combination 'b1, b2' will be expressed such that the first bit b1 is the bit x5, while the second bit b2 is the bit x6.

Suppose that the detector 22' has detected that the two bits x5, x6 equal '01'. As a result, the counter 26" increases the count value Ni,0 in the column 28' by one, and the count value Ni,3 in the column 30' by one, where i runs from 0 to 15 and corresponds to the i-th 4-bit bit sequence given in the column 32' of the table in FIG. 12.

Next, upon the application of a number of P clock pulses to the apparatus of FIG. 12, where P need not necessarily be equal to 2, but may be larger, another 4-bit bit sequence x1, x2, x3, x4 of the bitstream signal is stored in the shift register 20'. The detector 22' detects the bit values of the next two bits x5, x6 in the bitstream signal following the said 4-bit bit sequence. Suppose, the next two bits equal 11'. As a result, the counter 26" increases the count value Ni,1 in the column 29 by one, and the count value Ni,5 in the column 31 by one, where i corresponds to the 4-bit bit sequence stored in the shift register 20', which is assumed to be the i-th 4-bit bit sequence given in the column 32' of the table in FIG. 12.

This procedure is repeated a plurality of times so that for all the sixteen possible 4-bit bit sequences x1, x2, x3, x4, the count values Ni,0 to Ni,5 have been obtained. The count values Ni,0 to Ni,5 indicate the number of occurrences of the 1-bit and 2-bit bit sequences following the i-th 4-bit bit sequence given in column 32'.

Next, either a predicted binary value x5' or a predicted 2-bit binary sequence x5', x6' is derived, based upon the count values in the columns 28', 29, ... to 31, for each of the 4-bit bit sequences x1, x2, x3, x4 in the column 32.

Suppose that the count value Ni,0 or the count value Ni,1 of the six count values Ni,0 to Ni,5 for the i-th 4-bit bit-sequence in column 32' is substantially larger than all the others. In such situation, one can decide to choose the '0' bit or '1' bit, respectively, as the prediction bit x5'. Suppose that Ni,0 and Ni,2 do not differ very much and are larger than the other four count values. In such a situation, one could decide to choose the bit combination '00' as the prediction bits x5', x6' for the i-th bit sequence. In this way, the conversion table obtained can thus comprises a column 33 which may comprise either a 1-bit value as a prediction bit for predicting the bit following a specific 4-bit bit sequence in the bitstream signal, or a 2-bit binary word as a 2-bit prediction word for predicting the 2-bit word following another specific 4-bit bit sequence in the bitstream signal.

Figure 13:
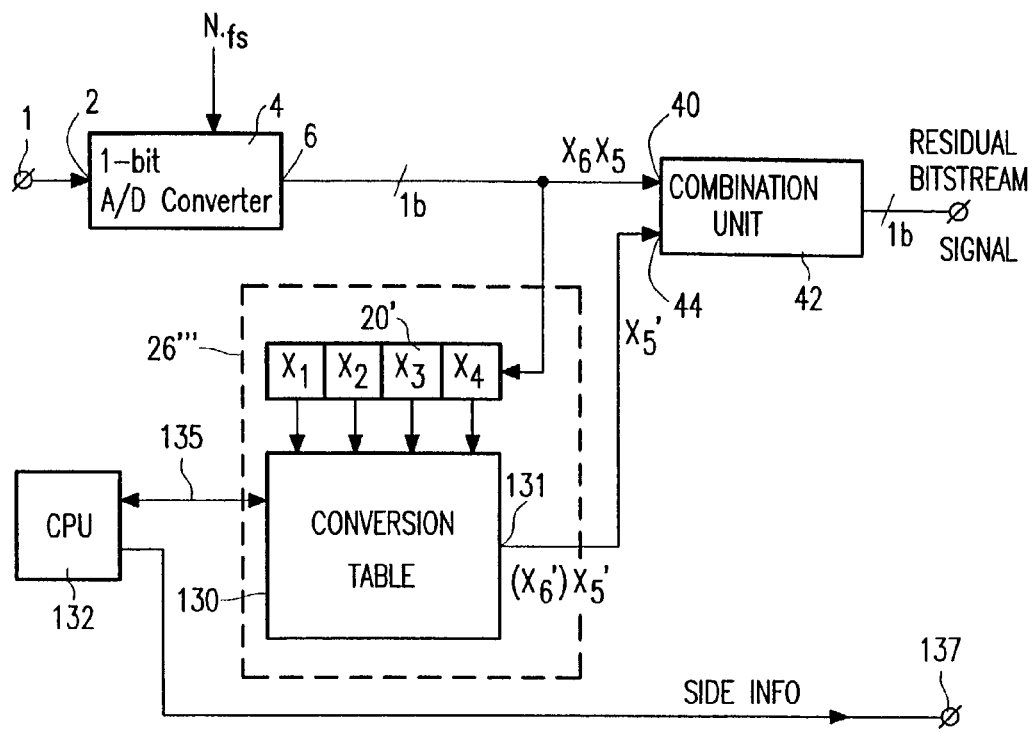
FIG. 13 shows another embodiment of the data processing apparatus.

FIG. 13 shows, schematically, another embodiment of the data processing apparatus for data processing an audio signal, the data processing apparatus comprising a conversion unit 130 in the form of a conversion table, such as the one explained with reference to FIG. 12. This means that the conversion table comprises the columns 32' and 33 given in FIG. 12, so that upon the receipt of a specific 4-bit bit sequence x1, x2, x3, x4, as given in column 32', a specific prediction bit x5 or two specific prediction bits x5, x6 will be generated at the output 131 of the conversion unit 130.

The functioning of the apparatus of FIG. 13 is as follows. In response to a specific 4-bit bit sequence stored in the shift register 20', the conversion unit 130 generates, for example, a one bit word, equal to '1'. This is the case when a 4-bit bit sequence '0000' is stored in the shift register 20'. The column 33 shows that upon such 4-bit bit sequence, see column 32' in the table of FIG. 12, a '1' bit is predicted, see the column 33 in the table of FIG. 12. The predicted bit x5' is supplied to the input 44 of the combination unit 42 in which the predicted bit x5' is combined with the real bit x5 in the bitstream present at the input 40. Next, upon one clock pulse generated by a central processing unit 132, the information in the shift register 20' is shifted one position to the left, so that the bit x5 is now stored in the most right storage location of the shift register 20'. Suppose this bit is indeed a '1' bit, as predicted.

Next, the conversion unit converts the 4-bit bit sequence '0001' stored in the shift register 20' into a 2-bit word '01', see the columns 32' and 33 in the table of FIG. 12, this 2-bit word being supplied to the output 131. The central processing unit 132 now generates two clock pulses so that the 2-bit prediction word '01' can be combined in the combination unit 42 with the actual bits x5, x6 in the bitstream signal. The two clock pulses also result in a shift by two positions to the left in the shift register 20' so that the shift register has the values '0' and '1' stored in the positions in the shift register 20', indicated by x1 and x2, and the actual bits x5 and x6 mentioned above are now stored as the new bits x3 and x4 in the shift register 20'. Thus, upon predicting one bit, the central processing unit 132 generates one clock pulse, after which a subsequent prediction step is carried out, whereas, upon predicting a 2-bit word, the central processing unit 132 generates two clock pulses before a subsequent prediction step is carried out.

Figure 14:
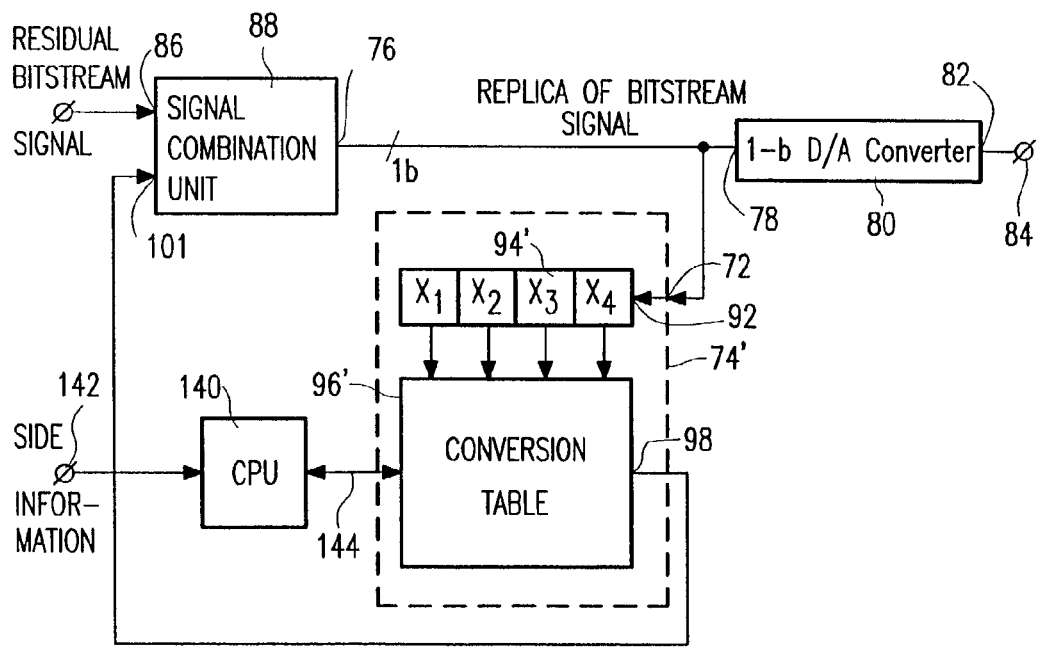
FIG. 14 shows an embodiment of a data processing apparatus for reconverting the residual bitstream signal obtained by the apparatus of FIG. 13 into a replica of the original audio signal.

Suppose that, for subsequent portions of the bitstream signal, a corresponding conversion table is derived first, e.g., in the way explained above with reference to FIG. 12, it is desired to transmit the conversion table together with the residual bitstream signal so as to enable reconversion upon reception of the residual bitstream signal. FIG. 13 shows a connection 135 between the prediction unit 26''' and the central processing unit 132. Via this connection, the conversion table derived in the way described with reference to FIG. 12 can be supplied to the central processing unit 132, and subsequently supplied to an output 137 for transmission together with the residual bitstream signal via the transmission medium FIG. 14 shows a corresponding apparatus for reconverting the residual bitstream signal supplied by the apparatus of FIG. 13. The apparatus of FIG. 14 shows a large resemblance with the apparatus of FIGS. 7 and 8, in the sense that the signal combination unit 88 and the D/A converter 80 are the same as the signal combination unit and the D/A converter, respectively, of FIG. 7. The input 72 of the prediction unit 74' is coupled to an input 92 of a 4-bit shift register 94'. The four outputs of the four bit positions in the shift register 94' are coupled to corresponding inputs of a conversion unit 96'. The conversion unit 96' comprises the conversion table discussed and explained above with reference to the FIG. 12. An output 98 of the conversion unit 96' is coupled to a second input 101 of the signal combination unit 88.

In response to a 4-bit bit sequence x1, x2, x3, x4 stored in the shift register 94', the conversion unit 96' supplies either a 1-bit x5' at its output 98 or a 2-bit word x5', x6', in the way explained above with reference to FIG. 12. This bit x5' is a prediction of the bit x5, given by the conversion table 96', that will be supplied, upon the next clock pulse, by the combination unit 88 and stored as the new bit x4 in the most right storage position of the shift register 94'. The residual bit present at the input 86 of the combination unit 88 is combined with the predicted bit x5' upon the clock pulse generated by the central processing unit 140, so as to form the replica of the original bit x5 in the original bitstream signal. When the residual bit is '0', which means that a correct prediction was carried out in the apparatus of FIG. 13, the combination of the residual bit with the predicted bit x5' results in the right of the bit x5' to appear at the output 90 of the combination unit 88 as the bit x5. When the residual bit is '1', which means that an incorrect prediction was carried out in the apparatus of FIG. 13, the combination of the residual bit with the predicted bit x5' results in the inverse right of the bit x5' to appear at the output 90 of the combination unit 88 as the bit x5. In both cases, a correct replica of the bit x5 will appear at the output 76 of the combination unit 88.

The 2-bit prediction x5', x6' is a prediction of the 2-bit word x5, x6, generated by the conversion table 96', that will be supplied, upon the next two clock pulses of the central processing unit 140, by the combination unit 88 and stored as the new 2-bit word x3, x4 in the two most right storage positions of the shift register 94'. Two residual bits present at the input 86 of the combination unit 88 are combined with the predicted 2-bit word x5', x6' so as to form the replica of the original 2-bit word x5, x6 in the original bitstream signal. When the two residual bits are '0,0', which means that a correct prediction was carried out in the apparatus of FIG. 13, the combination of the residual bits with the predicted bits x5', x6' results in the right of the two bits x5', x6' to appear at the output 90 of the combination unit 88 as the bits x5, x6. When the residual bits were '1,1', which meant that an incorrect prediction was carried out in the apparatus of FIG. 13 on both the bits x5 and x6, the combination of the two residual bits with the predicted bits x5', x6' results in the inverse bit values of the bits x5', x6' to appear at the output 90 of the combination unit 88 as the bits x5, x6. When one of the two residual bits is '1' and the other is '0', this means that one of the prediction bits is wrong and should be inverted in order to obtain two correct bits x5, x6. In all cases, a correct replica of the 2-bit word x5, x6 will appear at the output 76 of the combination unit 88.

In the situation where, for subsequent portions of the bitstream signal, a corresponding conversion table is derived first in the apparatus of FIG. 13, e.g., in the way explained above with reference to FIG. 12, it is desired to transmit the conversion table together with the residual bitstream signal so as to enable reconversion upon reception of the residual bitstream signal in the apparatus of FIG. 14. FIG. 14, therefore, shows an input terminal 142 for receiving the conversion table. The input terminal 142 is coupled to the central processing unit 140, which has a connection 144 with the prediction unit 96'. Via this connection, the conversion table can be supplied to the prediction unit 96'.

It has been said earlier that a data compression step is carried out on the residual bitstream signal prior to transmission. Preferably, a data compression using a lossless coder is carried out. Lossless coders have the advantage that they can data compress the audio signal in such a way that, after data expansion by a lossless decoder, the original audio signal can be reconstructed in a substantially lossless way. That means that there is substantially no loss of information after compression-expansion. Lossless coders can be in the form of a variable length coder. Variable length coders are well known in the art. Examples of such variable length coders are Huffman coders, arithmetic coders and Lempel-Ziv coders. Reference is made in this respect to the publications 'A method for the construction of minimum-redundancy codes' by D. A. Huffman, document D4 in the List of Related Focuments, 'An introduction to arithmetic coding', by G. G. Langdon, document D5 in the List of Related Documents, and 'A universal algorithm for sequential data compression' by J. Ziv et al, document D6 in the List of Related Documents.

Figure 15:
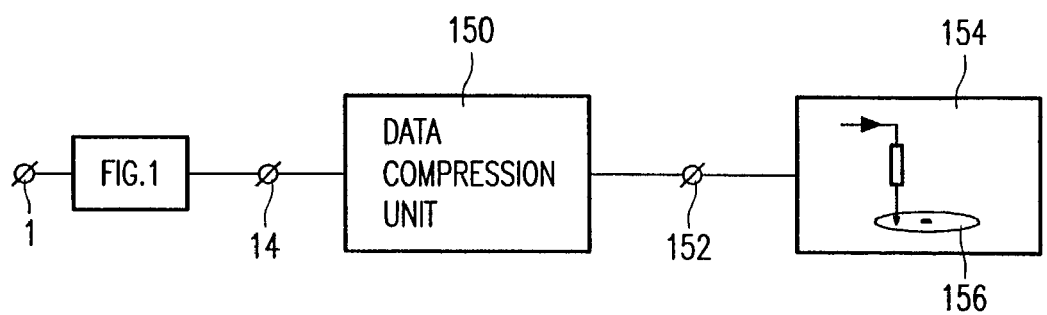
FIG. 15 shows the application of a data compression unit in a recording apparatus.

FIG. 15 shows an embodiment in which the apparatus of FIG. 1 is followed by a data compression unit 150, such as a lossless coder. The data-compressed residual bitstream signal, supplied to an output 152, is recorded on an optical record carrier 156 by an optical recording unit 154.

Figure 16:
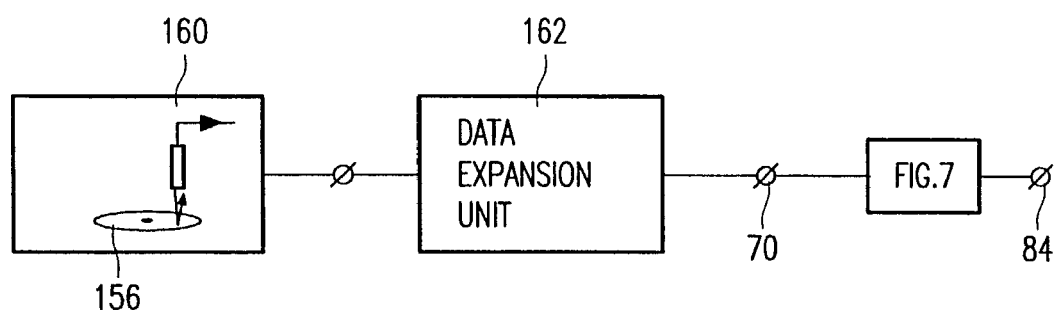
FIG. 16 shows the application of a data expansion unit in a reproduction apparatus.

FIG. 16 shows the corresponding reproduction from the optical record carrier 156 using an optical reading unit 160. The apparatus shown in FIG. 16 comprises a data expansion unit 162, such as a lossless decoder, that carries out a data expansion step on the data-compressed residual bitstream signal. The regenerated residual bitstream signal is supplied to the input 70 of the apparatus of FIG. 7.

Figure 18:
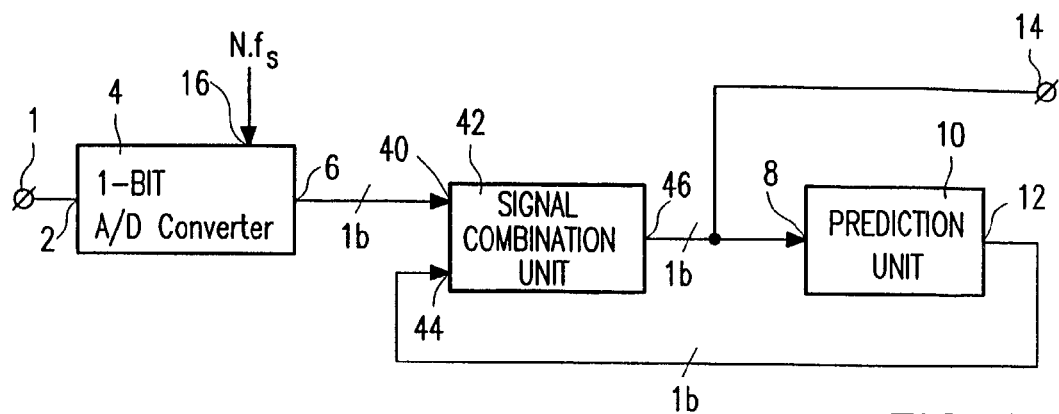
FIG. 18 shows a modification of the apparatus of FIG. 1.

A further modification of the embodiment of FIG. 1 is as follows. In this modification, the prediction unit 10 is coupled between the output of the signal combination unit 42 and the input 44 of the signal combination unit 42. In this modification, the predicted version of the bitstream signal is derived by the prediction unit from the residual signal, supplied by the signal combination unit 42. This modification is shown in FIG. 18, which is, in fact, identical to the circuit construction of the prediction unit and the signal combination unit shown in FIG. 7.

In an equivalent way, a further modification of the embodiment of FIG. 7 is as follows. In this modification, the prediction unit 74 is coupled between the input terminal 70 and the input 101 of the signal combination unit 88. In this modification, the predicted version of the bitstream signal is derived by the prediction unit from the residual signal, supplied to the processing apparatus via the terminal 70. This modification is, in fact, identical to the circuit construction of the prediction unit and the signal combination unit shown in FIG. 1.

Figure 21:
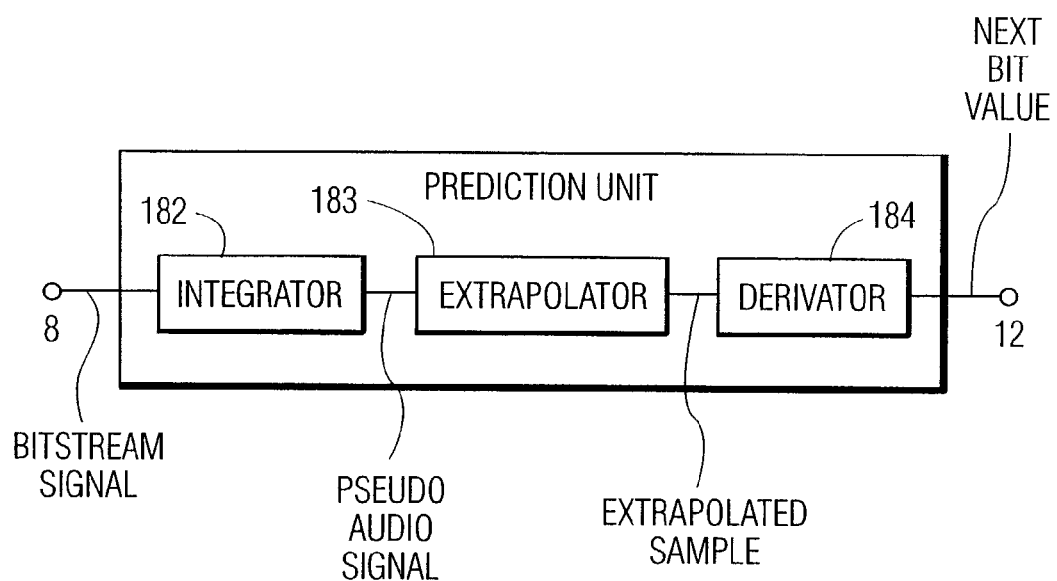
FIG. 21 shows the prediction unit of FIG. 1 including an integrator.

A further improvement of the data processing apparatus can be obtained by a specific embodiment of the prediction unit, such as the prediction unit 10 in FIG. 1. In this specific embodiment, shown in FIG. 21, the prediction unit 10 is provided with an integrator 182 for integrating the input signal, which is a representation of the bitstream signal, in the sense that the input signal has −1 and +1 representation values to represent the '0' and '1' bits in the bitstream signal. The integrator simply sums all the representation values, so its instantaneous output is the cumulative sum of all −1 and +1 values it has received. What the prediction unit, in fact, does is to generate a pseudo-audio signal, and the predicted bit for the bitstream signal to be supplied to the output 12 is derived from this pseudo-audio signal in the following way.

The prediction unit includes an extrapolator 183 which derives, from the last n sample values of the pseudo-audio signal generated by the integrator, a prediction value for the next sample of the pseudo-audio signal. Next, in a derivator 184, the value of the last sample of the pseudo-audio signal generated is compared with the predicted value of the next sample. If, viewed along an amplitude axis, the value of the last sample of the pseudo-audio signal is smaller than the prediction value of the next sample, it is concluded that the next predicted bit in the predicted bitstream signal corresponds to the +1 value (or logical '1'), and when the value of the last sample of the pseudo-audio signal is larger than the prediction value of the next sample, it is concluded that the next predicted bit in the bitstream signal corresponds to the −1 value (or logical '0'). The predicted bits are supplied to the output of the prediction unit 10 as the predicted bitstream signal.

The predicted value of the next sample can be obtained by approximating the last n (which, e.g., equals 40) samples of the pseudo-audio signal with a straight line. It will be understood that more sophisticated approximation procedures (filter techniques) are equally well possible to predict the next sample value. In such a situation, as said earlier, filter coefficients for such filters should be derived for the signal on a frame basis and transmitted so as to enable a corresponding decoding on the receiver side.

Figure 19:
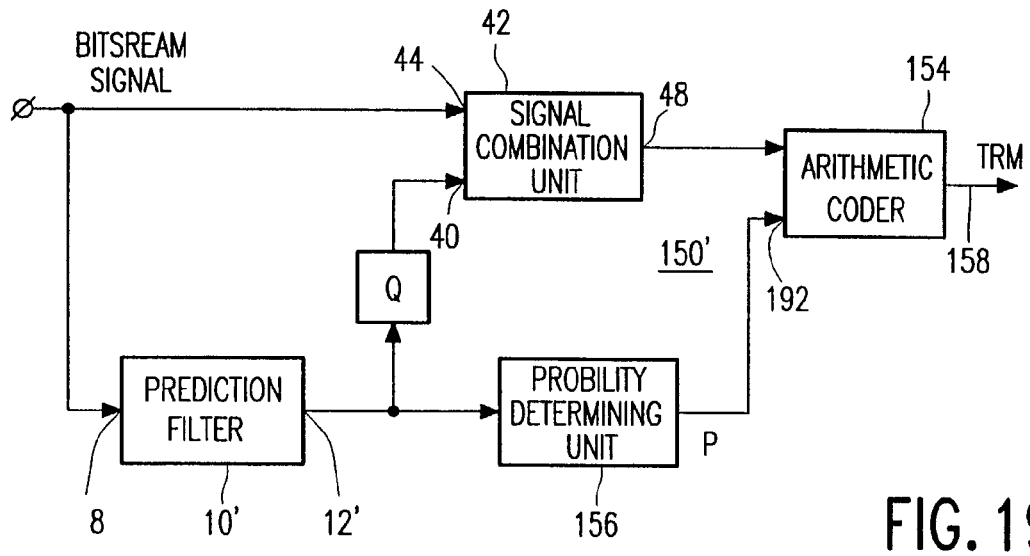
FIG. 19 a data processing apparatus provided with an arithmetic coder.

Another data processing apparatus is shown in FIG. 19. In the data processing apparatus of FIG. 19, the bitstream signal is supplied to the input 44 of the signal combination unit 42, and, via a prediction filter 10' and a quantizer Q, to the input 40 of the signal combination unit 42. The apparatus is further provided with a data compression unit 150' which comprises an entropy encoder 154 and a probability determining unit 156. In the present example, the entropy encoder 154 is in the form of an arithmetic coder for encoding the residual bitstream signal into a data compressed residual bitstream signal in response to probability values p supplied to its input 192. The probability determining unit 156 determines a probability value indicating the probability that a bit in the residual bitstream signal, supplied by the combination unit 42, has a predetermined logical value, such as '1'. This probability value, denoted p in FIG. 19, is supplied to the arithmetic coder 154 so as to enable the data compression of the residual bitstream signal in the arithmetic coder 154. The determining unit 156 determines this probability value from the output signal of the prediction filter 10'. This is different from what one would expect when using an arithmetic coder in the data compression unit 150, such as in FIG. 4 or 15, for compressing the residual bitstream signal. When using an arithmetic coder in the compression unit 150, the probability unit 156 would derive the probability value from the residual bitstream signal itself. In the embodiment of FIG. 19, however, the probability determining unit 156 derives the probability value from the output signal generated by the prediction filter 10'. This has an advantage, in that a higher compression ratio can be obtained with the arithmetic coder 154. The arithmetic coder 154 can data compress the residual bitstream signal on a frame basis.

The functioning of the apparatus of FIG. 19 is as follows. The prediction filter 10' realizes a prediction filtering on the bitstream signal so as to obtain a multi bit output signal. The multi bit output signal has a plurality of levels within a range of, e.g., +3 and −3. A quantizer Q receives the multi bit output signal and generates a bitstream signal therefrom, e.g., by allocating a bit of '1' logical value if the multi-bit output signal has a positive value, and allocating a bit of '0' logical value if the multi-bit output signal has a negative value. Further, for each of a plurality of sub-intervals in the value range of the multi bit output signal, it is determined what the probability is that the corresponding bit in the residual signal is, e.g., a '1' bit. This can be realized by counting the number of 'ones' and 'zeroes' occurring in the residual bitstream signal during a specific time interval, when the multi-bit output signal falls in one of such ranges. The probabilities thus obtained for the various values in the multi-bit output signal is subsequently supplied as the probability signal p to the arithmetic coder 154. The data compressed residual bitstream signal is supplied by the arithmetic coder 154 to an output line 158, for transmission via a transmission medium TRM.

Figure 20:
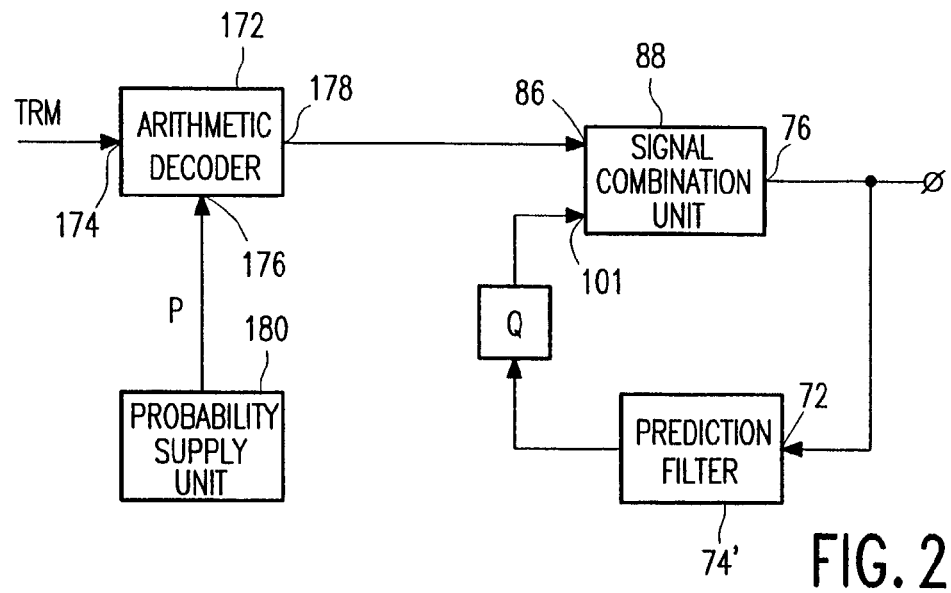
FIG. 20 a data processing apparatus provided with an arithmetic decoder.

FIG. 20 shows a corresponding data processing apparatus for decoding the data compressed residual bitstream signal, received via the transmission medium TRM. The data processing apparatus of FIG. 20 comprises an entropy decoder 172, which receives the data compressed residual bitstream signal via an input 174. In the present example, the entropy decoder 172 is in the form of an arithmetic decoder that carries out an arithmetic decoding step on the data compressed bitstream signal under the influence of a probability signal p, supplied to an input 176 so as to generate a replica of original residual bitstream signal which is supplied to an output 178. The replica is supplied to an input 86 of the signal combination unit 88. The signal combination unit 88 further receives a predicted version of the bitstream signal via the input 101 and generates the replica of the original bitstream signal at its output 76. The output 76 is coupled via a prediction filter 74' and a quantizer Q to the input 101 of the signal combination unit 88. The functioning of the prediction filter 74' and the quantizer Q can be identical to the functioning of the prediction filter 10' and the quantizer Q in FIG. 19, that is, the prediction filter 74' derives its filter coefficients from the input signal it receives via its input 72. In another embodiment, the prediction filter 74' receives the filter coefficients from side information received via the transmission medium TRM from the encoder apparatus of FIG. 19, as will be explained below.

Further, a probability supply unit 180 is present for supplying the probability signal p to the arithmetic decoder 172. The probability signal p can be obtained in different ways. One way is to derive the probability signal p from the output signal of the prediction filter 74', in the same way as the probability determining unit 156 determines then probability signal p from the prediction filter 10' in FIG. 19. In such situation, the supply unit 180 in FIG. 20 can be identical to the determining unit 156 in FIG. 19, and the supply unit 180 has an input coupled to the output of the prediction filter 74'. Another way of generating the probability signal p, is by using side information received via the transmission medium TRM, as will be explained hereafter.

Side information can be generated by the apparatus of FIG. 19 for transmission to the apparatus of FIG. 20. Such side information can include the filter coefficients for the filter 10' that are determined on a frame-by-frame basis, these coefficients being transmitted to the filter 74' for setting the correct filter characteristic of the filter 74'. Further, the apparatus of FIG. 19 can generate parameters that describe the conversion of the multi bit output signal of the prediction filter 10' into the probability signal p. Such parameters are also included in the side information and transmitted to the supply unit 180, so as to enable the regeneration of the probability signal p in the apparatus of FIG. 20.

In the above described embodiments of FIGS. 19 and 20, it is explained how the probability signal p can be derived from the multi-bit output signal from the prediction filter 10' and 74', respectively. It should, however, be noted that the application of an arithmetic coder is also possible in data processing apparatuses that derive the predicted signal in a different way. Reference is made in this respect to the embodiments shown in FIG. 1, where the prediction unit 10 is in the form as disclosed in FIG. 2 or 12. Now, another way of deriving the probability signal p is required. It will be clear that in the embodiments of the prediction unit as shown in FIGS. 2 and 12, the probability signal p can be derived from the count numbers derived in the detector 22 and 22', respectively.

The entropy encoder used in the embodiment of FIG. 19 is adapted to encode the residual bitstream signal using a probability signal in order to obtain the data compressed residual bitstream signal. One of such entropy encoder is the arithmetic coder described above. One other type of such entropy coder is, for example, the well-known finite state coder. The entropy decoder used in the embodiment of FIG. 20 is adapted to decode the data compressed residual bitstream signal using a probability signal in order to obtain a replica of the residual bitstream signal. One of such entropy decoder is the arithmetic decoder described above. One other type of such entropy decoder is, for example, the well-known finite state decoder.

While the invention has been described with reference to preferred embodiments thereof, it is to be understood that these are not limitative examples. Thus, various modifications may become apparent to those skilled in the art, without departing from the scope of the invention. When the audio signal is supplied in digital form, such as sampled at 44.1 kHz and the samples being expressed in, e.g., 16 bits, the A/D converter means over-samples the digital audio signal with, e.g., the frequency of 64×44.1 kHz so as to form the 1-bit bitstream signal which is supplied to the prediction unit 10.

Further, as regards the conversion tables, such as the one shown and described in FIG. 12, the following can be said. In the phase of deriving the conversion table, it may occur that, for example, the count values are such that the bit sequences 0,0,0,0 and 0,0,1,0 result in the same prediction bit(s), that the bit sequences 0,0,0,1 and 0,0,1,1 result in the same prediction bit(s), that the bit sequences 0,1,0,0 and 0,1,1,0 result in the same prediction bit(s), that the bit sequences 1,0,0,0 and 1,0,1,0 result in the same prediction bit(s), the bit sequences 1,1,0,0 and 1,1,1,0 result in the same prediction bit(s), that the bit sequences 1,0,0,1 and 1,0,1,1 result in the same prediction bit(s), that the bit sequences 1,1,0,1 and 1,1,1,1 result in the same prediction bit(s), and that the bit sequences 0,1,0,1 and 0,1,1,1 result in the same prediction bit(s). In this situation, the bit x3 is, in fact, a 'don't care' bit and the prediction bit(s) x4 or x4, x5 can be predicted from the bit combination x1, x2, x4 alone.

Further, the invention lies in each and every novel feature or combination of features.

LIST OF RELATED DOCUMENTS (D1) European Patent Application No. EP-A 402,973 (PHN 13.241)

(D2) 'A digital decimating filter for analog-to-digital conversion of hi-fi audio signals', by J. J. van der Kam in Philips Techn. Rev. 42, no. 6/7, April 1986, pp. 230–8

(D3) 'A higher order topology for interpolative modulators for oversampling A/D converters', by Kirk C. H. Chao et al in IEEE Trans. on Circuits and Systems, Vol 37, no. 3, March 1990, pp. 309–18

(D4) 'A method for the construction of minimum-redundancy codes', by D. A. Huffman in Proc. of the IRE, Vol. 40(10), September 1952.
(D5) 'An introduction to arithmetic coding' by G. G. Langdon, IBM J. Res. Develop., Vol. 28(2), March 1984.
(D6) 'A universal algorithm for sequential data compression' by J. Ziv et al, IEEE TRans. on Inform. Theory, Vol. IT-23, 1977.
(D7) European Patent Application No. 96202807.2, filing date Oct. 10, 1996 (PHN 16.029)

The invention claimed is:

1. A data processing apparatus for data processing an audio signal, the data processing apparatus comprising:
input means for receiving an audio signal;
conversion means for converting the audio signal into a 1-bit bitstream signal, the conversion means comprising sigma-delta modulator means;
prediction means for carrying out a prediction step on the bitstream signal to form a predicted bitstream signal;
signal combination means for combining the bitstream signal and the predicted bitstream signal to form a residual bitstream signal; and
output means for supplying the residual bitstream signal.

2. The data processing apparatus as claimed in claim 1, wherein the audio signal is an analog audio signal, and the conversion means comprising A/D conversion means for carrying out a 1-bit A/D conversion on the analog audio signal to form said bitstream signal.

3. The data processing apparatus as claimed in claim 2, wherein said A/D conversion means is a sigma-delta modulator.

4. The data processing apparatus as claimed in claim 1, 2 or 3, wherein the prediction means comprises a predictor unit for predicting, from n subsequent bits in the bitstream signal, m prediction bits, said m prediction bits being predicted versions of m subsequent bits in the bitstream signal following said n subsequent bits in the bitstream signal, where n and m are integers larger than zero.

5. The data processing apparatus as claimed in claim 4, wherein the signal combination means combines the m prediction bits with said m subsequent bits in the bitstream signal to form m subsequent bits of the residual bitstream signal.

6. The data processing apparatus as claimed in claim 5, wherein the signal combination means comprises an EXOR gate.

7. The data processing apparatus as claimed in claim 6, wherein the prediction means comprises a conversion table for supplying m prediction bits in response to a sequence of n bits from the bitstream signal.

8. The data processing apparatus as claimed in claim 7, where the conversion table supplies m1 prediction bits for a first sequence of n bits of the bitstream signal, and m2 prediction bits for a second sequence of n bits of the bitstream signal.

9. The data processing apparatus as claimed in claim 8, wherein the prediction means comprises:
calculation means for determining, for a portion of the bitstream signal, a sequence of m bits following a predetermined sequence of n subsequent bits of the bitstream signal that has the highest probability of occurrence after the occurrence of said predetermined sequence of n bits in the bitstream signal; and
allocating means for allocating that sequence of m bits as the m prediction bits to the predetermined sequence of n bits.

10. The data processing apparatus as claimed in claim 5, wherein the prediction means comprises a conversion table for supplying m prediction bits in response to a sequence of n bits from the bitstream signal.

11. The data processing apparatus as claimed in claim 10, where the conversion table supplies m1 prediction bits for a first sequence of n bits of the bitstream signal, and m2 prediction bits for a second sequence of n bits of the bitstream signal.

12. The data processing apparatus as claimed in claim 11, wherein the prediction means comprises:
calculation means for determining, for a portion of the bitstream signal, a sequence of m bits following a predetermined sequence of n subsequent bits of the bitstream signal that has the highest probability of occurrence after the occurrence of said predetermined sequence of n bits in the bitstream signal; and
allocating means for allocating that sequence of m bits as the m prediction bits to the predetermined sequence of n bits.

13. The data processing apparatus as claimed in claim 4, wherein the prediction means comprises a conversion table for supplying m prediction bits in response to a sequence of n bits from the bitstream signal.

14. The data processing apparatus as claimed in claim 13, where the conversion table supplies m1 prediction bits for a first sequence of n bits of the bitstream signal, and m2 prediction bits for a second sequence of n bits in the bitstream signal, where m1 and m2 are integers not equal to each other.

15. The data processing apparatus as claimed in claim 14, wherein the prediction means comprises:
calculation means for determining, for a portion of the bitstream signal, a sequence of m bits following a predetermined sequence of n subsequent bits of the bitstream signal that has the highest probability of occurrence after the occurrence of said predetermined sequence of n bits in the bitstream signal; and
allocating means for allocating that sequence of m bits as the m prediction bits to the predetermined sequence of n bits.

16. The data processing apparatus as claimed in claim 4, wherein the prediction means comprises:
calculation means for determining, for a portion of the bitstream signal, a sequence of m bits following a predetermined sequence of n subsequent bits of the bitstream signal that has the highest probability of occurrence after the occurrence of said predetermined sequence of n bits in the bitstream signal; and
allocating means for allocating that sequence of m bits as the m prediction bits to the predetermined sequence of n bits.

17. A method for data processing an audio signal, the data processing method comprising the steps of:
receiving an audio signal;
converting the audio signal into a 1-bit bitstream signal, the conversion step comprising sigma-delta modulation;
carrying out a prediction step on the bitstream signal to form a predicted bitstream signal
combining the bitstream signal and the predicted bitstream signal to form a residual signal; and
supplying the residual signal.

18. A transmitter for transmitting an audio signal via a transmission medium, the transmitter comprising:
a data processing apparatus for data processing an audio signal, the data processing apparatus comprising:

input means for receiving an audio signal;
conversion means for converting the audio signal into a 1-bit bitstream signal, the conversion means comprising sigma-delta modulator means;
prediction means for carrying out a prediction step on the bitstream signal to form a predicted bitstream signal;
signal combination means for combining the bitstream signal and the predicted bitstream signal to form a residual bitstream signal; and
output means for supplying the residual bitstream signal;
data compression means for data compressing the residual bitstream signal to form a data-compressed residual bitstream signal; and
transmission means for applying the data-compressed residual bitstream signal to the transmission medium.

19. The transmitter as claimed in claim 18, the prediction means of the data processing apparatus comprising a conversion table for supplying m prediction bits in response to a sequence of n bits from the bitstream signal, wherein the transmission means further applies side information representative of the conversion table to the transmission medium.

20. The transmitter as claimed in claim 18, wherein the transmitter further comprises error correction encoding means and/or channel encoding means, for error correction encoding and/or channel encoding the data-compressed residual bitstream signal prior to application to the transmission medium.

21. The transmitter as claimed in any one of the claims 18 to 20, wherein the transmitter is in the form of an apparatus for recording an audio signal on a record carrier, and the transmission means is in the form of writing means for writing the residual bitstream signal in a track on the record carrier.

22. The transmitter as claimed in claim 21, wherein the record carrier is an optical or a magnetic record carrier.

23. A record carrier having tracks formed therein for receiving a recording signal, wherein said recording signal comprises a residual bitstream signal formed by the method as claimed in claim 17.

24. A data processing apparatus for data processing a residual bitstream signal to form a replica of an original audio signal, the data processing apparatus comprising:
input means for receiving the residual bitstream signal;
signal combination means for combining the residual bitstream signal with a predicted bitstream signal to form a reconverted bitstream signal;
prediction means for carrying out a prediction step on the reconverted bitstream signal to form said predicted bitstream signal;
D/A conversion means for D/A converting the reconverted bitstream signal to form the replica of the original audio signal; and
output means for supplying the replica of the original audio signal.

25. The data processing apparatus as claimed in claim 24, wherein the D/A conversion means comprise a sigma-delta demodulator.

26. The data processing apparatus as claimed in claim 24 or 25, wherein the prediction means comprise, a predictor unit for predicting, from n subsequent bits in the reconverted bitstream signal, m prediction bits, said m prediction bits being predicted versions of m subsequent bits in the reconverted bitstream signal following said n subsequent bits in the reconverted bitstream signal, where n and m are integers larger than zero.

27. The data processing apparatus as claimed in claim 26, wherein the signal combination means combines the m prediction bits with m bits in said residual bitstream signal to form said m subsequent bits of the reconverted bitstream signal.

28. The data processing apparatus as claimed in claim 27, wherein the signal combination means comprises an EXOR gate.

29. The data processing apparatus as claimed in claim 28, wherein the prediction means comprises a conversion table for supplying m prediction bits in response to a sequence of n bits from the reconverted bitstream signal.

30. The data processing apparatus as claimed in claim 29, where the conversion table supplies m1 prediction bits for a first sequence of n bits of the reconverted bitstream signal, and m2 prediction bits for a second sequence of n bits in the reconverted bitstream signal, where m1 and m2 are integers not equal to each other.

31. The data processing apparatus as claimed in claim 27, wherein the prediction means comprises a conversion table for supplying m prediction bits in response to a sequence of n bits from the reconverted bitstream signal.

32. The data processing apparatus as claimed in claim 31, where the conversion table supplies m1 prediction bits for a first sequence of n bits of the reconverted bitstream signal, and m2 prediction bits for a second sequence of n bits in the reconverted bitstream signal,
where m1 and m2 are integers not equal to each other.

33. The data processing apparatus as claimed in claim 26, wherein the prediction means comprises a conversion table for supplying m prediction bits in response to a sequence of n bits from the reconverted bitstream signal.

34. The processing apparatus as claimed in claim 33, where the conversion table supplies m1 prediction bits for a first sequence of n bits of the reconverted bitstream signal, and m2 prediction bits for a second sequence of n bits in the reconverted bitstream signal, where m1 and m2 are integers not equal to each other.

35. A method for data processing a residual bitstream signal to form a replica of an original audio signal, the data processing method comprising the steps of:
receiving the residual bitstream signal;
combining the residual bitstream signal with a predicted bitstream signal to form a reconverted bitstream signal;
carrying out a prediction step on the reconverted bitstream signal to form said predicted bitstream signal;
D/A converting the reconverted bitstream signal to form the replica of the original audio signal; and
supplying the replica of the original audio signal.

36. A receiver for receiving an audio signal via a transmission medium, the receiver comprising:
a data processing apparatus for data processing a residual bitstream signal to form a replica of an original audio signal, the data processing apparatus comprising:
input means for receiving the residual bitstream signal;
signal combination means for combining the residual bitstream signal with a predicted bitstream signal to form a reconverted bitstream signal;
prediction means for carrying out a prediction step on the reconverted bitstream signal to form said predicted bitstream signal;
D/A conversion means for D/A converting the reconverted bitstream signal to form the replica of the original audio signal; and output means for supplying the replica of the original audio signal;

receiving means for retrieving a data-compressed residual bitstream signal from the transmission medium; and data expansion means for data expanding the data-compressed residual bitstream signal to form said the residual bitstream signal.

37. The receiver as claimed in claim 36, the prediction means of the data processing apparatus comprising a conversion table for supplying m prediction bits in response to a sequence of n bits from the reconverted bitstream signal, wherein the receiving means further retrieves side information representative of the conversion table from the transmission medium.

38. The receiver as claimed in claim 36, wherein the receiver further comprises channel decoding means and/or error correction means, for channel decoding and/or error correcting the signal retrieved from the transmission medium to form said data-compressed residual bitstream signal.

39. The receiver as claimed in any one of the claims 36 to 38, wherein the receiver is in the form of an apparatus for reproducing an audio signal from a record carrier, and the receiving means is in the form of reading means for reading the data-compressed residual bitstream signal from a track on the record carrier.

40. A data processing apparatus for data processing a bitstream signal, the data processing apparatus comprising:

input means for receiving a 1-bit bitstream signal;

prediction means for carrying out a prediction step on the bitstream signal to form a predicted bitstream signal;

signal combination means for combining the bitstream signal and the predicted bitstream signal to form a residual bitstream signal;

data compression means for data compressing the residual bitstream signal, the data compression means being an entropy encoder for entropy encoding the residual bitstream signal in response to a probability signal to form a data compressed residual bitstream signal;

probability signal determining means for determining said probability signal from said prediction means; and output means for supplying the data-compressed residual bitstream signal.

41. The data processing apparatus as claimed in claim 29, wherein the prediction means comprises:

prediction filter means for carrying out a prediction filter operation on the bitstream signal to form a multi-value output signal; and quantizing means for quantizing the multi-value output signal to form the predicted bitstream signal, and wherein the probability determining means derives said probability signal from said multi-value output signal.

42. A method for data processing a bitstream signal, the data processing method comprising the steps of:

receiving a 1-bit bitstream signal;

carrying out a prediction step on the bitstream signal to form a predicted bitstream signal;

combining the bitstream signal and the predicted bitstream signal to form a residual bitstream signal;

data compressing the residual bitstream signal by entropy encoding the residual bitstream signal in response to a probability signal to form a data-compressed residual bitstream signal, the data compression step further comprising the substep of determining said probability signal; and supplying the data-compressed residual bitstream signal.

43. The data processing method as claimed in claim 42, wherein the prediction step comprises the substeps of:

carrying out a prediction filter operation on the bitstream signal so as to obtain a multi value output signal; and quantizing the multi-value output signal to form the predicted bitstream signal, and wherein the probability-determining substep comprises deriving said probability signal from said multi-value output signal.

44. A data processing apparatus for data processing a bitstream signal, the data processing apparatus comprising:

input means for receiving a 1-bit bitstream signal;

prediction means for carrying out a prediction step on the bitstream signal to form a predicted bitstream signal;

signal combination means for combining the bitstream signal and the predicted bitstream signal to form a residual bitstream signal; and output means for supplying the residual bitstream signal, wherein the prediction means comprises:

integrator means for integrating the bitstream signal to form a pseudo audio signal;

extrapolation means for deriving an extrapolated sample from the last n samples of the pseudo audio signal generated by the integrator means; and derivation means for deriving a next bit value of the predicted bitstream signal from the extrapolated sample and the last sample of the pseudo audio signal generated by the integrator means, where n is an integer value larger than 1.

45. A method for data processing a bitstream signal, the data processing method comprising the steps of:

receiving a 1-bit bitstream signal;

carrying out a prediction step on the bitstream signal to form a predicted bitstream signal;

combining the bitstream signal and the predicted bitstream signal to form a residual signal; and supplying the residual signal, wherein said prediction step comprises the substeps of:

integrating the bitstream signal to form a pseudo audio signal;

deriving an extrapolated sample from the last n samples of the pseudo audio signal; and deriving a next bit value of the predicted bitstream signal from the extrapolated sample and the last sample of the pseudo audio signal generated in the integration substep, where n is an integer value larger than 1.

46. A data processing apparatus for data processing a data-compressed residual bitstream signal to form a replica of a bitstream signal, the data processing apparatus comprising:

input means for receiving the data-compressed residual bitstream signal;

data expansion means, in the form of an entropy decoder, for entropy decoding the data-compressed residual bitstream signal in response to a probability signal to form a replica of said residual bitstream signal;

means for supplying said probability signal;

signal combination means for combining the residual bitstream signal with a predicted bitstream signal to form a reconverted bitstream signal;

prediction means for carrying out a prediction step on the reconverted bitstream signal to form said predicted bitstream signal; and output means for supplying the reconverted bitstream signal.

47. A method for data processing a data-compressed residual bitstream signal to form a replica of a bitstream signal, the data processing method comprising the steps of:
- receiving the data-compressed residual bitstream signal;
- data expanding the data-compressed residual bitstream signal to form a replica of the residual bitstream signal, the data expansion step comprising the sub-steps of:
  - entropy decoding the data-compressed residual bitstream signal in response to a probability signal, and supplying said probability signal;
- combining the residual bitstream signal with a predicted bitstream signal to form a reconverted bitstream signal;
- carrying out a prediction step on the reconverted bitstream signal to form said predicted bitstream signal; and
- supplying the reconverted bitstream signal.

48. A data processing apparatus for data processing a residual bitstream signal to form a replica of a bitstream signal, the data processing apparatus comprising:
- input means for receiving the residual bitstream signal;
- signal combination means for combining the residual bitstream signal with a predicted bitstream signal to form a reconverted bitstream signal;
- prediction means for carrying out a prediction step on the reconverted bitstream signal to form said predicted bitstream signal; and
- output means for supplying the reconverted bitstream signal, wherein the prediction means comprises:
- integrator means for integrating the reconverted bitstream signal to form a pseudo audio signal;
- extrapolation means for deriving an extrapolated value from the last n samples of the pseudo audio signal generated by the integrator means; and
- derivation means for deriving a next bit value of the predicted bitstream signal from the extrapolated value and the last sample of the pseudo audio signal generated by the integrator means, where n is an integer value larger than 1.

49. A method for data processing a residual bitstream signal so as to obtain a replica of a bitstream signal, the data processing method comprising the steps of:
- receiving the residual bitstream signal;
- combining the residual bitstream signal with a predicted bitstream signal to form a reconverted bitstream signal;
- carrying out a prediction step on the reconverted bitstream signal to form said predicted bitstream signal; and
- supplying the reconverted bitstream signal, wherein the said prediction step comprises the sub-steps of:
- integrating the reconverted bitstream signal to form a pseudo audio signal;
- deriving an extrapolated sample from the last n samples of the pseudo audio signal generated in the integration sub-step; and
- deriving a next bit value of the predicted bitstream signal from the extrapolated sample and the last sample of the pseudo audio signal generated in the integration sub-step, where n is an integer value larger than 1.

* * * * *